US007956689B2

(12) United States Patent
Hurwitz et al.

(10) Patent No.: US 7,956,689 B2
(45) Date of Patent: Jun. 7, 2011

(54) PROGRAMMABLE GAIN AMPLIFIER AND TRANSCONDUCTANCE COMPENSATION SYSTEM

(75) Inventors: Jonathan Ephraim David Hurwitz, Edinburgh (GB); Adrià Bofill-Petit, Barcelona (ES); Robert K. Henderson, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/577,536

(22) Filed: Oct. 12, 2009

(65) Prior Publication Data

US 2010/0117734 A1     May 13, 2010

Related U.S. Application Data

(63) Continuation-in-part of application No. 12/250,450, filed on Oct. 13, 2008, now Pat. No. 7,795,973.

(51) Int. Cl.
*H03F 3/45*     (2006.01)
(52) U.S. Cl. ............... 330/254; 330/51; 330/289; 330/9
(58) Field of Classification Search .............. 330/9, 254, 330/124 R, 295, 51, 310, 84
See application file for complete search history.

(56) References Cited

U.S. PATENT DOCUMENTS

| | | | |
|---|---|---|---|
| 4,636,711 A | 1/1987 | Freymuth | |
| 4,636,771 A | 1/1987 | Ochs | |
| 4,772,870 A | 9/1988 | Reyes | |
| 4,922,534 A | 5/1990 | Gorniak et al. | |
| 5,287,065 A | 2/1994 | Allfather | |
| 5,574,748 A | 11/1996 | Vander Mey et al. | |
| 5,732,223 A | 3/1998 | Moore et al. | |
| 5,758,070 A | 5/1998 | Lawrence | |
| 5,777,544 A | 7/1998 | Vander Mey et al. | |
| 5,929,750 A | 7/1999 | Brown | |
| 5,929,896 A | 7/1999 | Goodman et al. | |
| 5,933,071 A | 8/1999 | Brown | |
| 5,978,371 A | 11/1999 | Mason et al. | |
| 6,014,386 A | 1/2000 | Abraham | |
| 6,243,413 B1 | 6/2001 | Beukema | |

(Continued)

FOREIGN PATENT DOCUMENTS

EP     0580457 A1     1/1994

(Continued)

OTHER PUBLICATIONS

U.S. Appl. No. 12/869,595 Non-Final Office Action, Jan. 6, 2011.

(Continued)

*Primary Examiner* — Hieu P Nguyen
(74) *Attorney, Agent, or Firm* — Garlick Harrison & Markison; Bruce E. Garlick

(57) ABSTRACT

A programmable gain amplifier (PGA) system comprises selectable parallel transconductors in a front end, independently selectable serial amplification circuits in a back end. The back end is configured to receive an output of the front end and may include a plurality of current or voltage mode amplifiers in series. The PGA system also includes control circuitry to select a gain configuration for the PGA by selecting selectable components in the front and back ends. The PGA system may additionally include control circuitry configured to change the transconductance of one or more of the front end transconductors such that the gain configurations of the PGA are independent of variations such as those due to temperature and fabrication. The PGA system may be used between a signal receiver and an analog to digital converter.

24 Claims, 13 Drawing Sheets

U.S. PATENT DOCUMENTS

| | | |
|---|---|---|
| 6,353,628 B1 | 3/2002 | Wallace et al. |
| 6,360,278 B1 | 3/2002 | Lo et al. |
| 6,373,377 B1 | 4/2002 | Sacca et al. |
| 6,407,987 B1 | 6/2002 | Abraham |
| 6,411,163 B1 | 6/2002 | Enriquez |
| 6,518,839 B2 * | 2/2003 | Gibson et al. ................. 330/51 |
| 6,593,868 B2 | 7/2003 | Clara et al. |
| 6,888,485 B2 | 5/2005 | Splett et al. |
| 6,957,086 B2 | 10/2005 | Bahl et al. |
| 6,985,715 B2 | 1/2006 | Lee |
| 6,998,962 B2 | 2/2006 | Cope et al. |
| 7,005,943 B2 | 2/2006 | Cern |
| 7,042,351 B2 | 5/2006 | Kline |
| 7,053,756 B2 | 5/2006 | Mollenkopf et al. |
| 7,075,414 B2 | 7/2006 | Giannini et al. |
| 7,079,537 B1 | 7/2006 | Kanuri et al. |
| 7,221,196 B2 | 5/2007 | Shirani |
| 7,248,148 B2 | 7/2007 | Kline et al. |
| 7,269,403 B1 | 9/2007 | Miao |
| 7,330,143 B2 | 2/2008 | Kim et al. |
| 7,391,317 B2 | 6/2008 | Abraham et al. |
| 7,417,463 B1 | 8/2008 | Danesh et al. |
| 7,602,220 B1 | 10/2009 | Bofill-Petit et al. |
| 2001/0053207 A1 | 12/2001 | Jeon et al. |
| 2002/0010870 A1 | 1/2002 | Gardner |
| 2002/0026528 A1 | 2/2002 | Lo |
| 2002/0145996 A1 | 10/2002 | Robinson et al. |
| 2002/0154000 A1 | 10/2002 | Kline |
| 2002/0174423 A1 | 11/2002 | Fifield et al. |
| 2002/0181437 A1 | 12/2002 | Ohkubo et al. |
| 2003/0016123 A1 | 1/2003 | Tager et al. |
| 2003/0062990 A1 | 4/2003 | Shaeffer, Jr. et al. |
| 2003/0114153 A1 | 6/2003 | Shaver et al. |
| 2003/0129978 A1 | 7/2003 | Akiyama et al. |
| 2003/0133473 A1 | 7/2003 | Manis et al. |
| 2003/0169155 A1 | 9/2003 | Mollenkopf et al. |
| 2003/0184433 A1 | 10/2003 | Zalitzky et al. |
| 2003/0203721 A1 | 10/2003 | Berezdivin et al. |
| 2003/0224728 A1 | 12/2003 | Heinonen et al. |
| 2003/0227373 A1 | 12/2003 | Lou et al. |
| 2004/0003338 A1 | 1/2004 | Kostoff et al. |
| 2004/0022304 A1 | 2/2004 | Santhoff et al. |
| 2004/0032320 A1 | 2/2004 | Zalitzky et al. |
| 2004/0047427 A1 | 3/2004 | Dostert et al. |
| 2004/0056734 A1 | 3/2004 | Davidow |
| 2004/0077353 A1 | 4/2004 | Mahany |
| 2004/0107588 A1 | 6/2004 | Pu |
| 2004/0113756 A1 | 6/2004 | Mollenkopf |
| 2004/0113757 A1 | 6/2004 | White, II et al. |
| 2004/0174851 A1 | 9/2004 | Zalitzky et al. |
| 2004/0213237 A1 | 10/2004 | Yasue et al. |
| 2004/0220766 A1 | 11/2004 | Harbord et al. |
| 2004/0246107 A1 | 12/2004 | Kline |
| 2005/0018668 A1 | 1/2005 | Cheriton |
| 2005/0020227 A1 | 1/2005 | Kumigawa et al. |
| 2005/0031047 A1 | 2/2005 | Maltsev et al. |
| 2005/0089061 A1 | 4/2005 | Logvinov et al. |
| 2005/0094647 A1 | 5/2005 | Hata et al. |
| 2005/0141473 A1 | 6/2005 | Lim et al. |
| 2005/0143973 A1 | 6/2005 | Taniguchi et al. |
| 2005/0157670 A1 | 7/2005 | Tang et al. |
| 2005/0174950 A1 | 8/2005 | Ayyagari |
| 2005/0190826 A1 | 9/2005 | Van Bruyssel et al. |
| 2005/0249245 A1 | 11/2005 | Hazani et al. |
| 2006/0031477 A1 | 2/2006 | Ayyagari |
| 2006/0038662 A1 | 2/2006 | White, II et al. |
| 2006/0045066 A1 | 3/2006 | Choi et al. |
| 2006/0097574 A1 | 5/2006 | Gidge et al. |
| 2006/0106961 A1 | 5/2006 | Ebata et al. |
| 2006/0120399 A1 | 6/2006 | Claret et al. |
| 2006/0126617 A1 | 6/2006 | Cregg et al. |
| 2006/0146866 A1 | 7/2006 | Horvath et al. |
| 2006/0176898 A1 | 8/2006 | Chan et al. |
| 2006/0215691 A1 | 9/2006 | Kobayashi et al. |
| 2006/0233101 A1 | 10/2006 | Luft et al. |
| 2006/0291575 A1 | 12/2006 | Berkman et al. |
| 2007/0002771 A1 | 1/2007 | Berkman et al. |
| 2007/0008972 A1 | 1/2007 | Sifnatsch et al. |
| 2007/0025386 A1 | 2/2007 | Riedel et al. |
| 2007/0060151 A1 | 3/2007 | Lee |
| 2007/0076595 A1 | 4/2007 | Lee et al. |
| 2008/0001801 A1 | 1/2008 | Nhuyen |
| 2009/0022175 A1 | 1/2009 | Logvinov et al. |
| 2009/0128386 A1 | 5/2009 | Meynants et al. |

FOREIGN PATENT DOCUMENTS

| | | |
|---|---|---|
| EP | 1134909 A1 | 9/2001 |
| EP | 1351408 B1 | 10/2003 |
| EP | 1388954 A2 | 2/2004 |
| EP | 1531568 A1 | 5/2005 |
| EP | 1548974 A2 | 6/2005 |
| EP | 1432138 B1 | 9/2005 |
| WO | 0195518 A2 | 12/2001 |
| WO | 03015291 A2 | 2/2003 |
| WO | 03077443 A1 | 9/2003 |
| WO | 03092212 A1 | 11/2003 |
| WO | 2004100392 A1 | 11/2004 |
| WO | 2005039070 A2 | 4/2005 |
| WO | 2006017743 A2 | 2/2006 |
| WO | 2006074174 A1 | 7/2006 |

OTHER PUBLICATIONS

"Broadband Powerline Communications Systems, A Background Brief," Australian Communications Authority, Sep. 2003.

Crowley, Patrick et al., "Network Processor Design—Issues and Practices," vol. 1, pp. 1 and 11, Morgan Kaufmann Publishers, San Francisco, 2003.

Int'l Search Report, PCT/US2007/015508, Dated Jun. 28, 2008.

Int'l Preliminary Report on Patentability, PCT/US2007/015508, Dated Jan. 6, 2009.

Int'l Preliminary Report on Patentability, PCT/US2007/016736, Dated Jan. 27, 2009.

Int'l Search Report, PCT/GB2006/003665, Dated Mar. 12, 2007.

Written Opinion, PCT/GB2006/003665 Dated Apr. 3, 2008.

Int'l Search Report, PCT/US2008/00020, Dated Oct. 2, 2008.

Written Opinion, PCT/US2008/00020, Dated Apr. 14, 2008.

Int'l Search Report, PCT/GB2008/050364, Dated Aug. 19, 2008.

Int'l Search Report, PCT/GB2008/050365, Dated Aug. 13, 2008.

Yukitoshi, Sanada, A Multiuser Interference Cancellation Technique Utilizing Convolutional Colds and Orthogonal Multicarrier Modulation for Wireless Indoor Communications, IEEE Journal of Selected Areas in Communications, vol. 14, No. 8, Oct. 1996, pp. 1500-1508.

Gardner, S., et al., HomePlug Standard Brings Networking to the Home, CSD, Dec. 2000.

UPA—Universal Powerline Association, Frequently Asked Questions, date unknown.

Powerstream Technology Background, Adaptive Networks, Inc., 2002.

Stelts, Michael, CEPCA Standard Summary, 2006.

Digital Home Statndard, Universal Powerline Association (UPA), 2005.

Powerline Communications Systems-Access/In-home & In-home/In-home Coexistence Mechanism—General Specifications, Universal Powerline Association (UPA), Jun. 27, 2005.

Opera Technology Specification—Part 1, Open PLC European Research Alliance (OPERA), Jan. 31, 2006.

Opera System Specification—Part 2, Open PLC European Research Alliance (OPERA), Jan. 31, 2006.

HomePlug 1.0 Technology White Paper, HomePlug Powerline Alliance.

HomePlug AV White Paper, HomePlug Powerline Alliance, 2005.

Juttner, A., et al., Tree Based Broadcast in Ad Hoc Networks, Sep. 9, 2004, pp. 1-21, Errisson Research, Traffic Analysis and Network Performance Laboratory, Budapest, Hungary.

Kouvatsos, D., et al., Broadcasting Methods in Ad Hoc Networks: An Overview, Proceeding of the 3rd International Working conference on Performance Modelling and Evaluation of Heterogeneous Networks, Jul. 20, 2005, pp. 1-14.

PCT/EP2009/057284 Int'l Search Report and Written Opinion, Dated Aug. 28, 2009.

PCT/US09/48090 International Search Report and Written Opinion, mailed Dec. 2, 2009.

PCT/US09/60478 International Search Report and Written Opinion, mailed Nov. 18, 2009.
PCT/US09/60482 International Search Report and Written Opinion, mailed Dec. 2, 2009.
PCT/US10/24125 International Search Report and Written Opinion, mailed Apr. 15, 2010.
Tang, C.; Stolpman, V.J., "Multiple Users Adaptive Modulation Schemes for MC-CDMA," Global Telecommunications Conference, 2004. GLOBECOM '04. IEEE, vol. 6, pp. 3823-3827 Nov. 29-Dec. 3, 2004.
Crussiere, M.; Baudais, J.-Y.; Herlard, J.-F., "Robust and High-Bit Rate Communications over PLC Channels: a Bit-Loading Multi-Carrier Spread Spectrum Solution," Power Line Communications and its Applications, 2005 International Symposium on, pp. 37-41, Apr. 6-8, 2005.
Cheong Yui Wong; Cheng, R.S.; Lataief, K.B.; Murch, R.D., "Multiuser OFDM with Adaptive Subcarrier, Bit, and Power Allocation," Selected Areas in Communications, IEEE Journal on, vol. 17, No. 10, pp. 1747-1758, Oct. 1999.
Int'l Search Report and Written Opinion, PCT/US07/24309, Dated Jun. 25, 2010.
Int'l Search Report and Written Opinion, PCT/US10/49182, Dated Nov. 3, 2010.
Int'l Search Report and Written Opinion, PCT/US10/49184, Dated Nov. 8, 2010.

* cited by examiner

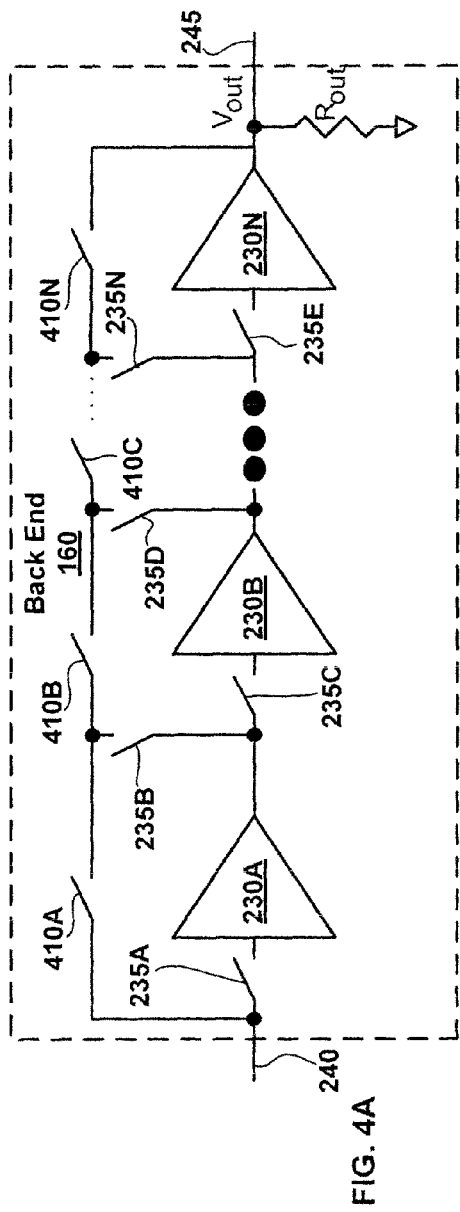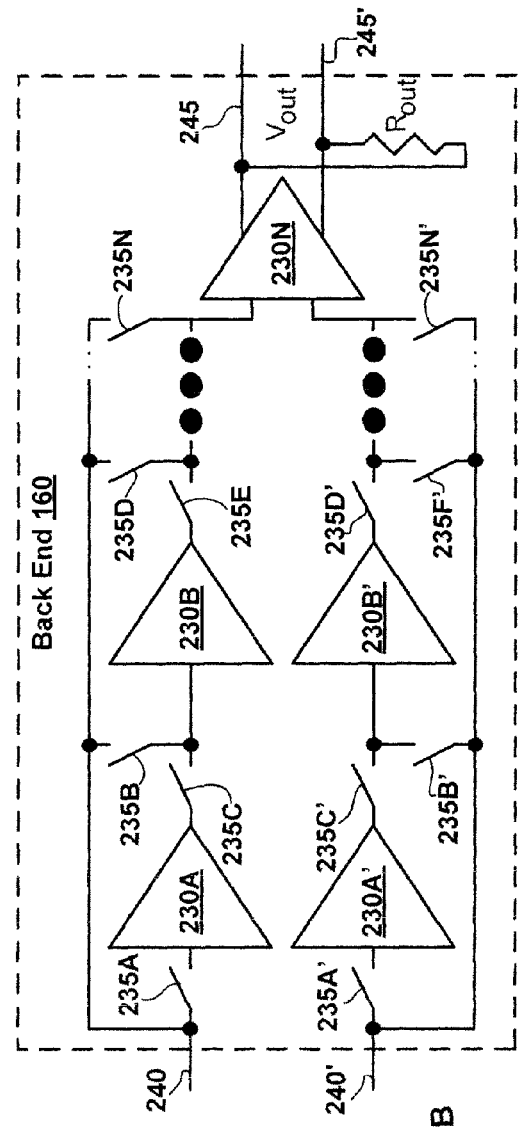

PROGRAMMABLE GAIN AMPLIFIER AND TRANSCONDUCTANCE COMPENSATION SYSTEM

CROSS-REFERENCE TO RELATED APPLICATIONS

This application is a Continuation-in-part of U.S. patent application Ser. No. 12/250,450 entitled "Programmable Gain Amplifier" filed Oct. 13, 2008 and issued as U.S. Pat. No. 7,795,973 on Sep. 14, 2010. This application is related to U.S. patent application Ser. No. 11/467,141 entitled "Multi-Wideband Communications over Power Lines" filed Sep. 28, 2006; U.S. patent application Ser. No. 12/075,888 entitled "Coupling Signal Processing Circuitry with a Wireline Communication Medium" filed Mar. 14, 2008; U.S. patent application Ser. No. 11/752,887 entitled "Multi-Wideband Communications over Multiple Mediums" filed May 23, 2007; and U.S. patent application Ser. No. 12/145,475 entitled "Resistor-Input Transconductor Including Common-Mode Compensation" filed Jun. 24, 2008 and issued as U.S. Pat. No. 7,602,220 on Oct. 13, 2009. The disclosures of each of the above patent applications are incorporated herein by reference.

BACKGROUND

1. Field of the Invention

The invention is in the field of electronics and more specifically in the field of programmable amplification.

2. Related Art

The receipt of signals in communication systems often includes amplification of analog signals and conversion of these signals to digital values using an analog to digital converter. The magnitude of the received signal may be dependent on the signal's strength at its source, the distance and path traveled, and the efficiency of detection of the signal. As a result, the magnitude of received communication signals may vary widely and unpredictably.

A wide variability in signal magnitude may result in loss of information when the signal is converted to digital values at the analog to digital converter. Analog to digital converters typically are configured to convert signals over a set magnitude range to a set number of digital bits. For example, an analog to digital converter may be configured to convert signals between 0 and 5 Volts to an eight bit digital value. In this case the maximum digital value is generated when the signal is at 5 Volts and the minimum digital value (0) is generated when the signal is at 0 Volts. Problems arise when the received signal is between, for example, 0 and 2 Volts or 0 and 10 Volts. In these cases the signal is mismatched to the input range of the analog to digital converter. The best signal to noise is achieved when the signal is matched to the input range of the analog to digital converter.

Because of these problems it is well known to pass the received signal through a programmable gain amplifier. The programmable gain amplifier may be configured to apply a gain larger than one or a gain smaller than one to the signal. For example, a gain greater than one may be used to increase a 0 to 2 Volt signal to 0 to 5 Volts, and a gain less than one may be used to decrease a 0 to 10 Volt signal to 0 to 5 Volts.

There are two general approaches to programmable gain amplifiers. In one approach the programmable gain amplifier includes a single gain stage whose gain can be changed by, for example, changing the value of a resistance or capacitance. In an alternative approach a series of fixed gain stages are used to produce a stepwise variable gain. In this approach switches are used to control which of the gain stages are included in a signal path. By adding or removing gain stages from the signal path different amounts of gain may be achieved. It is possible for a programmable gain amplifier to include both variable and fixed gain stages.

One problem in using a series of gain stages is that any noise introduced by the first gain stage is amplified by later stages. As a result it is preferable to include as much of the total gain of the series in the first gain stage. This first stage must also be able to receive and amplify a wide range of signal magnitudes. Another problem of using a series of gain stages is to maintain linearity of the system. It turns out that to optimize the linearity of the system it is preferable to include as much of the total gain of the series in the last of the gain stages.

These two factors result in a trade-off between linearity and noise for the system. To minimize noise one would prefer to place most of the gain in the first stages but to optimize linearity one would prefer to place most of the gain in the later stages. There is, therefore, a need for improved programmable gain amplifiers.

SUMMARY

Various embodiments of the invention comprise a programmable gain amplifier comprising a front end including one or more transconductors and a back end including one or more current-mode gain stages. Each of the front end and the back end are separately programmable so as to control gain and other operating characteristics of the programmable gain amplifier. For example, gain of the front end may be controlled by alternatively coupling the output of the one or more transconductors to the output of the front end. Gain of the back end may be controlled by including or not including individual members of the one or more current-mode gain stages in the current path.

Transconductors within the front end are optionally in a parallel array wherein the inputs of each can be coupled to a common point and the outputs of each can be coupled to another common point. For example, the outputs of each transconductor may be switchably coupled to the same conduction (output) point, e.g., coupled through one or more switches such that the coupling can be switched on and off. Each of the transconductors may be configured to receive signals within specific frequency and/or voltage ranges. As such, switches may be used to select which transconductor is within the single path responsive to the characteristics of the signal.

The current-mode gain stages of the back end comprise current amplifiers in series. Members of the current-mode gain stages can be switched in and out of the signal path to select which stages are used to amplify the signal, and thus how much amplification the signal receives.

By using separately variable front and back ends, one of which is configured to convert voltage to current and the other current-to-current or current-to-voltage, tradeoffs between optimizing signal amplification and minimizing noise may be reduced relative to the prior art. The elements of each stage may be single-ended or differential, and the amplification may result in an increase or a decrease in the magnitude of the signal.

Various embodiments of the invention include a system comprising: a front end comprising a first transconductor configured to receive a voltage and generate a current proportional to the voltage received by the first transconductor, a second transconductor in parallel with the first transconductor and configured to receive a voltage and generate a current proportional to the voltage received by the second transconductor, and a switch configured to create a signal path from an input of the front end to an output of the front end through alternatively the first transconductor or the second transconductor; and a back end comprising a first current-mode gain stage configured to receive current from the front end and to generate a current proportional to the current received from the front end, a second current-mode gain stage in series with the first current-mode gain stage, configured to receive current via the first current-mode gain stage, and configured to generate current proportional to the current received by the second current-mode gain stage, and a switch configured to select whether or not the second current-mode gain stage is included in a signal path from an input of the back end to an output of the back end.

Various embodiments of the invention include a method comprising: receiving a signal; setting a first switch to alternatively create a first signal path through a first but not a second of a plurality of parallel transconductors, or create the first signal path through the second but not the first of the plurality of parallel transconductors; generating a first current proportional to a voltage of the signal by passing the signal through the first signal path: setting a second switch to alternatively create a second signal path through a first and a second of a plurality of serial current-mode gain stages, or create the signal path through the second but not the first of the serial current-mode gain stages; and generating a second current proportional to the first current by passing the signal through the second signal path.

Various embodiments of the invention include a system comprising: a front end comprising alternatively selectable parallel means for receiving a voltage and converting the received voltage to a current; a back end comprising serial means for variably amplifying the current; and control logic configured to control a ratio between the received voltage and the current, and a ratio between the current and the amplified current.

Various embodiments of the invention include a method comprising: receiving a signal; setting a first switch to create a first signal path through one of a plurality of parallel transconductors; generating a first current proportional to a voltage of the signal by passing the signal through the first signal path; setting a second switch to create a second signal path through a first and a second of a plurality of serial current-mode gain stages; and generating a second current proportional to the first current by passing the signal through the second signal path.

BRIEF DESCRIPTION OF THE DRAWINGS

FIGS. 4A and 4B illustrate alternative embodiments of a back end, according to various embodiments of the invention.

DETAILED DESCRIPTION

An improved programmable gain amplifier includes different types of circuits in a front end and a back end. The front end comprises a plurality of transconductors in parallel. Switches are configured to create a signal path selectively through one or more of these transconductors, responsive to the magnitude of a received signal. Each of the transconductors is configured to generate a current proportional to a received signal voltage. The ratio of received voltage to generated current is typically different for each transconductor. Each transconductor may further be configured to receive signals in a different voltage range. For example, one transconductor may be configured to receive signals between 0 and 1 Volts while another of the transconductors is configured to receive signals between 0 and 2 Volts. The plurality of transconductors in the front end allows for the selection and use of a transconductor best configured to receive a particular signal. In various embodiments this allows for amplification of the signal while maximizing the signal to noise ratio at the output of the front end. The front end may be operated in a differential or single-end mode.

The back end comprises a plurality of amplifiers in series. These serial amplifiers are typically configured to operate in current mode (e.g., to amplify a current). Switches are configured to select which members of the plurality of amplifiers are included in a signal path between an input and an output of the back end. The total amplification that occurs in the back end is a function of the number and/or identity of the members of the plurality of amplifiers that are included in the signal path for any particular state of the switches. The total amplification of the programmable gain amplifier is the combination of the amplification of the front end and the back end. Either of these segments may have an amplification that is less than or greater than one.

The programmable gain amplifier is optionally configured to provide an amplified signal to an analog to digital converter. For example, some embodiments include control logic configured to program (e.g. by setting switches of the front end and/or back end) the programmable gain amplifier to amplify the signal such that it is matched to the dynamic range of the analog to digital converter.

Figure 1:
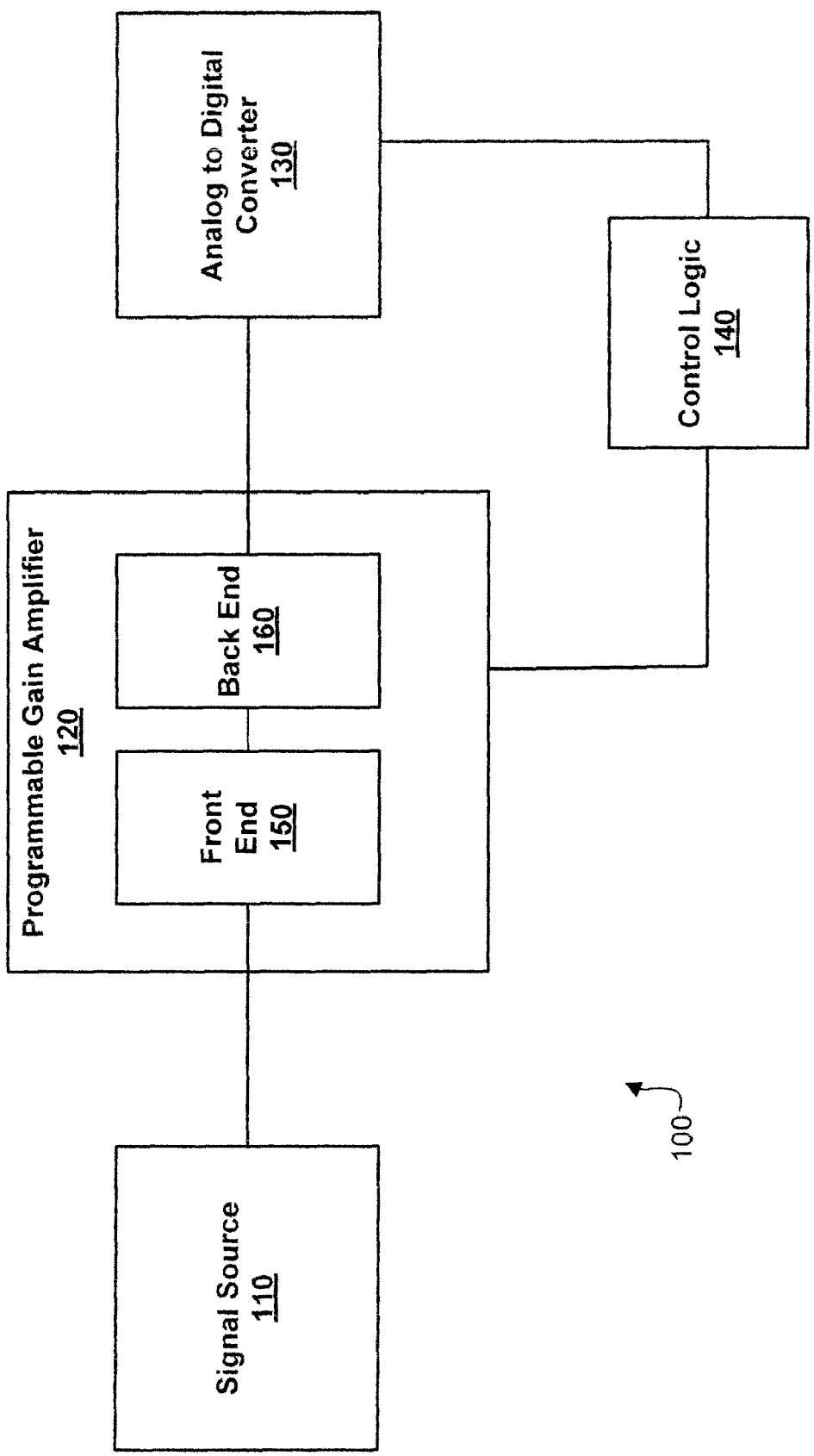
FIG. 1 illustrates a signal processing system, according to various embodiments of the invention.

FIG. 1 illustrates a Signal Processing System 100, according to various embodiments of the invention. Signal Processing System 100 includes a Signal Source 110, a Programmable Gain Amplifier 120, an Analog to Digital Converter 130, and a Control Logic 140. Signal Source 110 may include, for example, an antenna, a communication cable connector, a sensor, an optical coupler, a transducer, a coaxial cable connector, a telephone cable connector, or the like. For example, in some embodiments Signal Source 110 comprises an interface configured to receive a digitally encoded signal from a power line communication system in which data and electrical power are transmitted over the same conductors. An example of such an interface is provided in the U.S. patent applications cited elsewhere herein. Signal Source 110 is configured to provide a signal in the form of a current or a voltage to Programmable Gain Amplifier 120. This current or voltage may be differential or single-ended. The signal optionally includes digitally encoded data.

Programmable Gain Amplifier 120 is optionally configured to receive the signal from Signal Source 110 and to amplify the signal. This amplification may include raising or lowering the magnitude of the signal. For example, if the amplification ratio is greater than one, the magnitude will be increased. Likewise if the amplification ratio is less than one, the magnitude of the signal will be decreased. Programmable Gain Amplifier 120 is optionally further configured to provide the amplified signal to Analog to Digital Converter 130.

Analog to Digital Converter 130 is configured to generate a digital value representative of the amplified signal. For example. Analog to Digital Converter 130 may include an 8-bit analog to digital converter configured to generate an 8-bit representation of the amplified signal. Analog to Digital Converter 130 is typically characterized by an input voltage range, a data size (e.g., 8-bit, 16-bit, 24-bit, 32-bit, etc.), a bandwidth, and/or the like. The input voltage range is the range of voltages that correspond to the range in digital output values. For example, if Analog to Digital Converter 130 is characterized by an input voltage range of 0 to 1 Volt, then (in an 8-bit data size) 0 bits on will represent approximately 0 Volts and all 8 bits on will represent approximately 1 Volt. In various embodiments, a wide range of input voltage ranges, including positive and/or negative voltages, is possible.

Programmable Gain Amplifier 120 is optionally programmed to generate a signal within the input voltage range of Analog to Digital Converter 130. This programming is performed using Control Logic 140 and includes setting switches within Programmable Gain Amplifier 120. Control Logic 140 includes, for example, hardware, software or firmware configured to set these switches. Control Logic 140 is typically responsive to a magnitude of the signal as detected within Programmable Gain Amplifier 120, Analog to Digital Converter 130, or in other circuits. For example, the digital representation generated by Analog to Digital Converter 130 may be provided to Control Logic 140 wherein the digital representation is processed to determine if switches should be changed.

Control Logic 140 is optionally configured to separately control switches in a Front End 150 and a Back End 160 of Programmable Gain Amplifier 120. For example, Control Logic 140 may be configured to determine an amount of amplification that occurs in each of the Front End 150 and the Back End 160 so as to optimize both signal to noise and linearity of the amplification process. In some embodiments, Control Logic 140 is configured to set switches to achieve the best linearity possible while still maintaining a signal to noise requirement. In some embodiments, Control Logic 140 is configured to set switches to achieve the best signal to noise while maintaining a linearity requirement. In some embodiments, Control Logic 140 is configured to receive information regarding the signal to noise of the signal and change switches accordingly. For example, the output of Analog to Digital Converter 130 may be processed to identify messages encoded there in. When this processing results in uninterpretable data, information indicating that an improved signal to noise may be needed is sent to Control Logic 140. Control Logic 140 may then change switches accordingly.

Front End 150 comprises a plurality of circuits in parallel. These circuits are alternatively selectable to be within a signal path from an input of the Front End 150 to an output of the Front End 150. One or more of these circuits will be in the signal, path at a time. These circuits may include amplifiers, followers, or the like. For example, in various embodiments these circuits include a plurality of transconductors. Transconductors are circuits configured to receive a voltage and generate a current proportional to the received voltage. Transconductors are characterized by a transconductance (g) which is a ratio of a current I at an output to a voltage V at an input. Transconductance can be represented by the formula $g=I/V$, or in a differential mode $g=\Delta I/\Delta V$. Typically, each transconductor within Front End 150 is characterized by a different transconductance. The transconductors may also be characterized by different input ranges. For example, one transconductor may be configured to receive signals between 0 and 1 Volt while another of the transconductors is configured to receive signals between 0 and 4 Volts. Optionally the transconductance of these circuits is approximately proportional to the size of the input ranges for which they are optimized. For example, the transconductance of the transconductor having a 0-4 Volt range may be ¼ the transconductance of the transconductor having a 0-1 Volt range. As a result, the currents they generate over their input ranges will be approximately the same. Front End 150 may be configured in a differential mode or a single-ended mode.

The output of Front End 150 is received by Back End 160. For example, where Front End 150 comprises a set of transconductors in parallel, Back End 160 is configured to receive the current generated by the selected member or members of the transconductors. Back End 160 comprises a plurality of selectable current-mode gain stages. These current mode gain stages are each configured to receive a current and generate a proportional output current. The ratio of the input current to the output current is referred to herein as the gain. When the output current is greater than the input current the gain is greater than one.

The gain of the Back End 160 is the product of the gain of each of the current-mode gain stages. The gain of the Back End 160 is programmable by selecting which of the current mode gain stages are included in a signal path between an input of the Back End 160 and an output of the Back End 160. This selection is typically made by setting switches included in Back End 160. The current gain stages may have gains less than, equal to, or greater than one.

The Back End 160 may be configured in a differential and/or single-end configuration. For example, each of the current mode gain stages may be differential or single-ended. If Front End 150 is configured in a differential mode, Back End 160 may comprise a series differential mode current gain stages, or two parallel series of single-end current gain stages. In some embodiments Back End 160 comprises a mixture of differential and single-end current gain stages.

Back End 160 optionally further comprises a current to voltage converter configured to convert a current output of a final current gain stage from a current to a voltage. This current to voltage converter optionally includes resistors from each of the outputs to a low-impedance node such as ground, or a resistor between differential outputs.

As discussed elsewhere herein, Programmable Gain Amplifier 120 is programmable to generate an output that matches the input range of Analog to Digital Converter 130. In selecting a total gain of Programmable Gain Amplifier 120, gross steps in gain (and, thus, amplification) are typically made using Front End 150 and fine steps in gain are made using Back End 160. For example, in some embodiments the differences in transconductance of transconductors within Front End 150 are on the order of 18 dB while the difference in gain of Back End 160 that can be achieved by setting switches to include various members of the current gain stages in the signal path are on the order of 6 dB or less. A gross step is defined as a step that is larger than a fine step. The fine steps may be less than ½, ⅓, ¼, ⅕, ⅐ or ⅛ of the gross steps.

Figure 2:
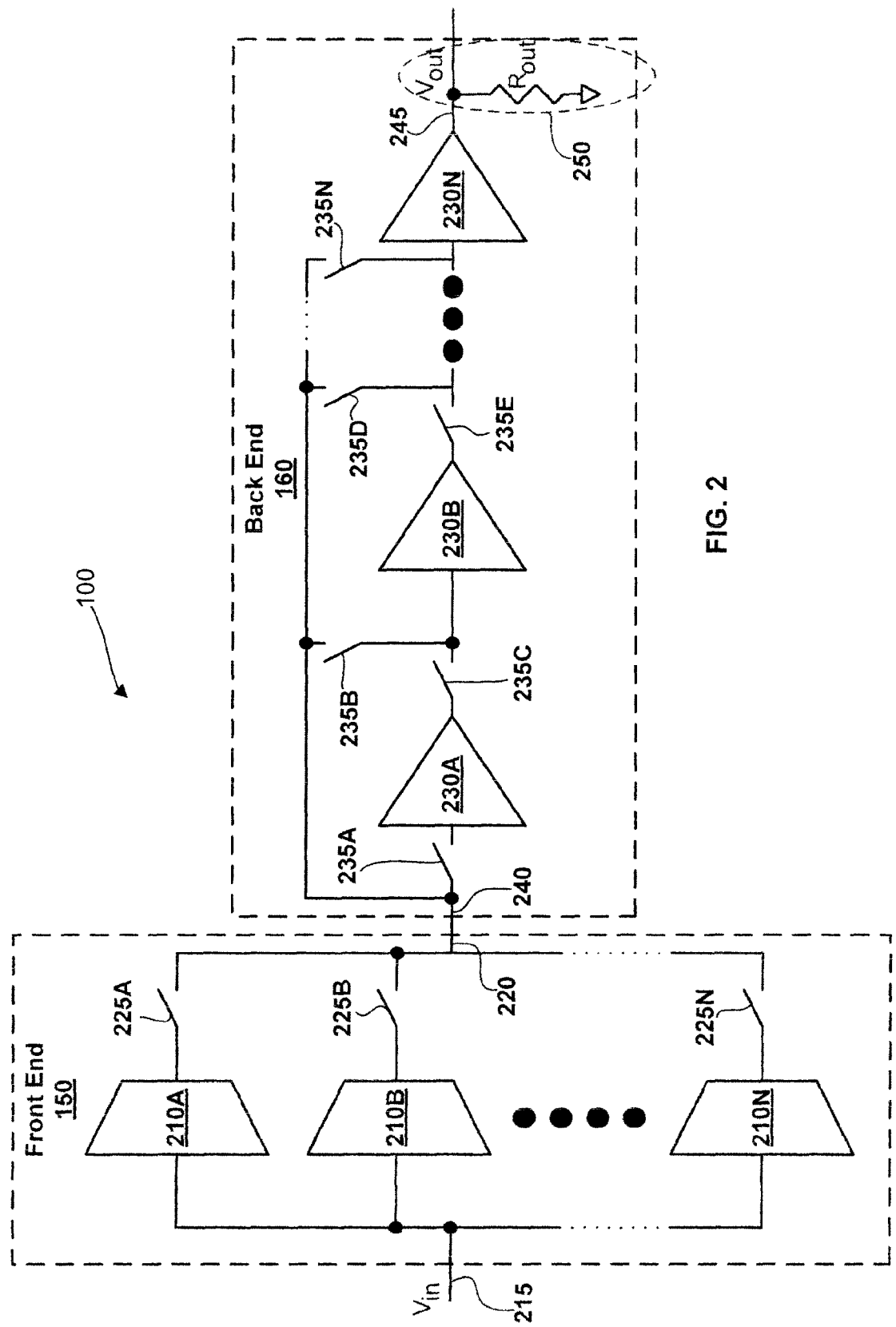
FIG. 2 illustrates a programmable gain amplifier comprising a front end and a back end, according to various embodiments of the invention.

FIG. 2 illustrates further details of Programmable Gain Amplifier 120 comprising a Front End 150 and a Back End 160, according to various embodiments of the invention. In these embodiments, Front End 150 comprises a plurality of Transconductors 210, individually labeled 210A, 210B . . . 210N. One or more Transconductors 210 may be placed in a signal path between an Input 215 and an Output 220 of Front End 150. This placement is controlled by Switches 225, individually labeled 225A, 225B . . . 225N. Front End 150 may comprise 2, 3, 4 or more pairs of Transconductors 210 and Switches 225. In some embodiments only one of Switches 225 is closed at once. For example, to include Transconductor 210B in the signal path Switch 225B is closed and the other Switches 225 are opened. In alternative embodiments, Switches 225 are disposed between Input 215 and Transconductors 210 rather than between Output 220 and Transconductors 210 as shown. In still other embodiments, more than one of the Switches 225 are closed at once. In these embodiments the transconductance of the Front End 150 is the sum of the transconductances of the Transconductors 210 placed in parallel in the circuit.

For example, in various embodiments the transconductances of successive Transconductors 210 differ by a same amount, for example, 6 dB. Other suitable differences between successive Transconductors 210 in the Front End 150 include 12 dB, 18 dB, 24 dB, or 30 dB. The term "step" is used herein to refer to the transconductance difference between successive transconductors. The transconductances may include values less than, equal to, and greater than one. Typically, each of Transconductors 210 is optimized to receive signals of a specific voltage range and to introduce a minimal amount of noise and/or distortion into the signal at this voltage range. Transconductors 210 optionally also differ in their frequency response or include a tunable frequency response. In some embodiments, the gain contribution steps within Front End 150 are different. For example, Transconductor 210A may contribute −10 dB, Transconductor 210B may contribute 2 dB and Transconductor 210N may contribute 10 dB. Here, the first gain contribution step is 12 dB while the second gain contribution step is 8 dB.

In the embodiments illustrated in FIG. 2 Back End 160 comprises a plurality of Current Gain Stages 230, individually labeled 230A, 230B . . . 230N. Switches 235 are used to control which of Current Gain Stages 230 are included in a signal path between an Input 240 and an Output 245 of Back End 160. Back End 160 may comprise 1, 2, 3, 4 or more (N) Current Gain Stages. One, two or more of Current Gain Stages 230 may be included in the signal path at the same time. For example, if Switches 235B, and 235E are closed while Switches 235A, 235C, 235D . . . and 235N are open, then Current Gain Stages 230B . . . 230N, but not 230A will be included in the signal path.

Each of the Current Gain Stages 230 in the Back End 160 may have the same or different gain than the others. For example, in some embodiments, each of Current Gain Stages 230 has a gain of 6 dB. In some embodiments, some members of Current Gain Stages 230 have a gain of 6 dB while other members have a gain of 3 dB. Other gains are included in alternative embodiments, however, in most embodiments the gains of the Current Gain Stages 230 are smaller than the differences in transconductance between Transconductors 210. For example, if the difference in transconductances between successive Transconductors 210 is 18 dB, the gain of Current Gain Stages 230 may be 1, 2, 3, 6, and/or 9 dB. In some embodiments, a last of the Current Gain Stages 230, e.g., Current Gain Stage 230N is configured such that it is always included in the signal path. See FIG. 2. In these embodiments, this last Current Gain Stage 230N is configured to provide the output of Back End 160. For example, Current Gain Stage 230N may be configured to provide a current suitable for conversion to a voltage within the voltage input range of Analog to Digital Converter 130. By always including Current Gain Stage 230N in the signal path, output characteristics such as capacitive load, output impedance, and inductance may be held constant as the gain of Back End 160 is varied.

Optionally, one or more Current Gain Stages 230 within Back End 160 can have a variable gain as described in greater detail below with respect to FIG. 9. For example, Current Gain Stage 230A contributes 6 dB, Current Gain Stage 230B contributes 3 dB and Current Gain Stage 230N selectively contributes 0, 1 or 2 dB. Thus, Back End 160 provides gains between 0 and 11 dB in steps of 1 dB.

Back End 160 optionally further comprises a Conversion Circuit 250 configured to convert the current output of Current Gain Stage 230N to a voltage. Conversion Circuit 250 may include a resistor (with resistance $R_{out}$) as illustrated in FIG. 2. Other current to voltage circuits may be found in alternative embodiments.

Figure 3:
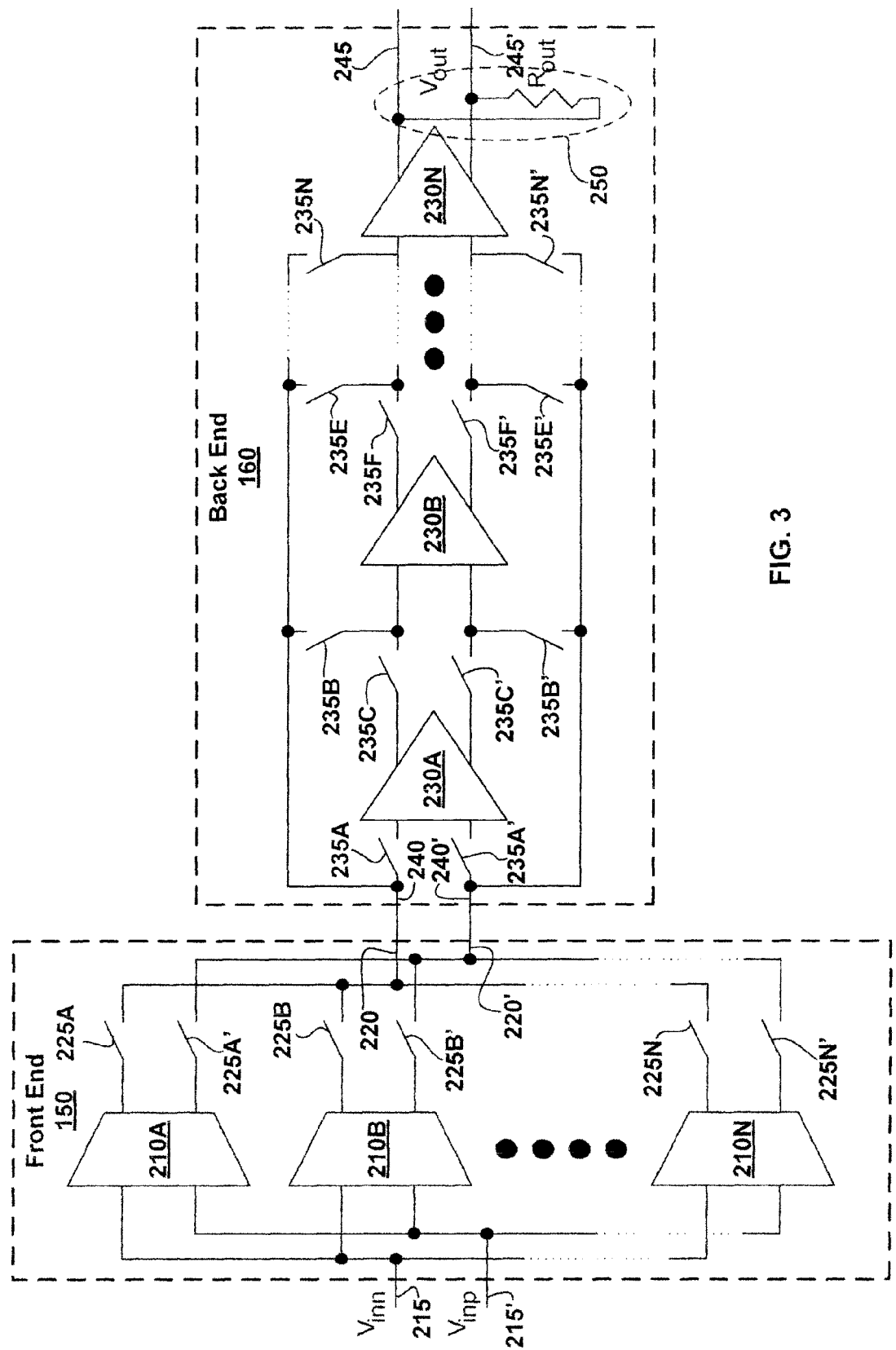
FIG. 3 illustrates a programmable gain amplifier comprising a differential mode front end and a differential mode back end, according to various embodiments of the invention.

The embodiments of Transconductors 210 and Current Gain Stages 230 illustrated in FIG. 2 are single-ended. However, in alternative embodiments, Transconductors 210 and/or Current Gain Stages 230 may be differential. FIG. 3 illustrates Programmable Gain Amplifier 120 comprising a differential mode Front End 150 and a differential mode Back End 160, according to various embodiments of the invention. In the differential mode Transconductors 210 generate two currents as output. The difference between these currents is proportional to the difference between two voltage inputs. Switches 225 are replaced by pairs of switches, labeled 225 and 225'. Likewise Switches 235 are replaced by pairs of switches, labeled 235 and 235'. In the differential mode Current Gain Stages 230 generate two output currents whose difference is proportional to a difference between two input currents. Conversion Circuit 250 optionally comprises a resistor disposed between the outputs of the final Current Gain Stage 230N.

In various alternative embodiments Front End 150 is differential while Back End 160 is single-ended, or Front End 150 is single-ended while Back End 160 is differential.

FIGS. 4A and 4B illustrate alternative embodiments of Back End 160, according to various embodiments of the invention. In FIG. 4A additional Switches 410 are configured to allow for further control of which members of Current Gain Stages 230 are included in the signal path. The embodiments of Back End 160 illustrated in FIG. 4A allow for exclusion of Current Gain Stages 230 starting at 230A by opening Switch 235A, closing Switch 235B, closing Switch 235C, closing Switch 410A and opening switch 410B, and next excluding Current Gains Stages 230A and 230B by opening Switch 235B, closing Switch 235D and Switch 4108. This exclusion from the left to right (as illustrated) can be stepped through Back End 160 by closing successive switches until only Current Gain Stage 230N is included in the signal path. The embodiments illustrated in FIG. 4A further allow for exclusion of Current Gain Stages 230 without necessarily starting at one end of Back End 160. For example, opening Switch 410A, 235C and closing of 235A, 235B, and 410B result in the inclusion of Current Gain Stage 230A and exclusion of Current Gain Stage 230B. Switches 410A, 410C . . . 410N may likewise be used to exclude individual Current Gain Stages 230. Addition of further switches to the embodiments illustrated in FIG. 2 would allow stepwise exclusion of Current Gain Stages 230 from either the left to the right or the right to the left.

FIG. 4B illustrates embodiments of Back End 160 in which some of Current Gain Stages 230 are single-ended while others of Current Gain Stages 230 are differential. Specifically, Current Gain Stages 230A, 230B, etc. and 230A', 230B', etc. are single-ended while Current Gain Stage 230N is differential. While the example illustrated shows the last Current Gain Stage 230N as being differential, other combinations of differential and single-ended Current Gain Stages 230 may be included in alternative embodiments.

Figure 5A:
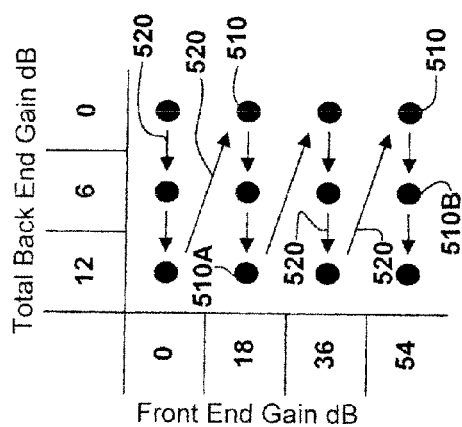
FIGS. 5A and 5B illustrate a matrix of programmable gains possible using the front end and the back end, according to various embodiments of the invention.
Figure 5B:
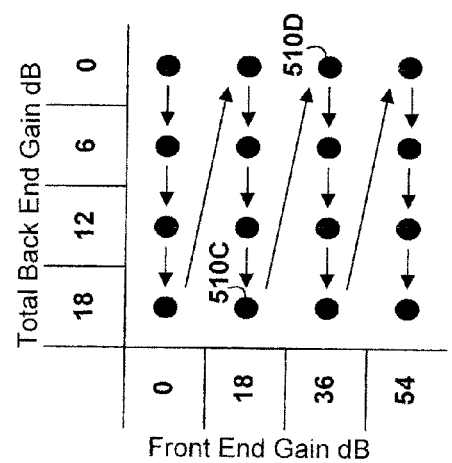

FIGS. 5A and 5B each illustrate a matrix of programmable gains possible using the front end and the back end, according to various embodiments of the invention. These matrixes illustrate how various combinations of front end gain and back end gain can be used together to produce a total gain of Programmable Gain Amplifier 120. For example, FIG. 5A shows three possible total gain contributions (0 dB, 6 dB and 12 dB) for Back End 160. In various embodiments, these values may be achieved by opening and closing Switches 235 to include and exclude Current Gain Stages 230 from the signal path. Specifically, these values could be obtained if Current Gain Stage 230N had a current gain of 0 dB. Current Gain Stage 230B had a current gain of 6 dB and Current Gain Stage 230A had a current gain of 6 dB. FIG. 5A also shows four possible gain contributions (0 dB, 18 dB, 36 dB, 54 dB) contributed by Front End 150. These values can be obtained if Transconductor 210A contributes 0 dB to the total gain of Programmable Gain Amplifier 120, Transconductor 2108 contributes 18 dB to the total gain. Transconductor 210C (not shown) contributes 36 dB to the total gain, and Transconductor 210N contributes 54 dB to the total gain.

The total gain of Programmable Gain Amplifier 120 may be stepped between different Gain States 510 as illustrated by the Arrows 520 shown in FIG. 5A. For example, gain may be changed in steps of 6 dB by following the path of Arrows 520. If required, transitions between gain states may take other paths. For example Programmable Gain Amplifier 120 may be changed from a Gain State 510A that includes 12 dB back end gain and 18 dB front end gain to a Gain State 510B that includes 6 dB back end gain and 54 dB front end gain.

FIG. 5B illustrates embodiments in which the programmable gains that can be achieved by changing the gain contributed by Back End 160 overlap with the gains that can be achieved by changing the gain of Front End 150. For example, a Gain State 510C and a Gain State 510D both provide approximately a total of 36 dB gain. Such overlapping gains may be advantageous when changing gain contribution in one of Front End 150 or Back End 160 is easier or creates less noise that changing the other.

Figure 6:
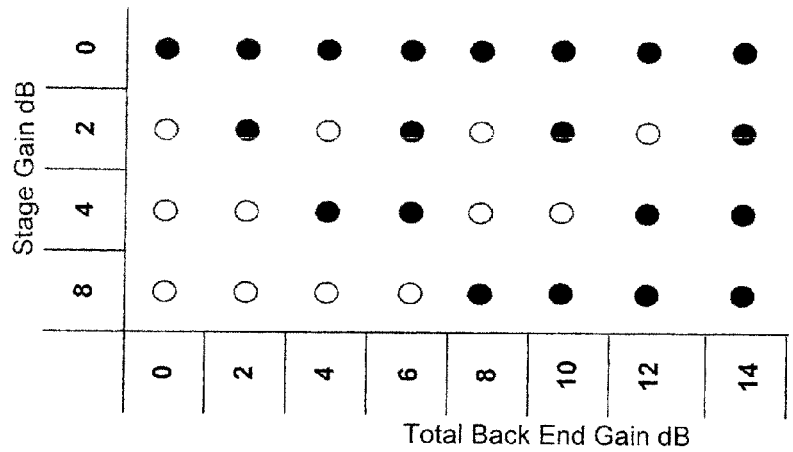
FIG. 6 illustrates various programmable gains within the back end, according to various embodiments of the invention.

FIG. 6 illustrates various programmable gain contributions within Back End 160, according to various embodiments of the invention. The x-axis represents the gains (8, 4, 2, and 0 dB) of four different Current Gain Stages 230. By including the appropriate Current Gain Stages 230 within the signal path, total gain contributions of Back End 160 may be selected from 0, 2, 4, . . . , 12, and 14 dB. The optional gain stage having 0 dB may or may not be included in each of the selections. The programmable gains illustrated in FIG. 6 may be achieved using a configuration such as that illustrated in FIG. 4A, where each of Current Gain Stages 230 can be independently selected for inclusion or exclusion in the signal path. In FIG. 6 open circles represent a Current Gain Stage 230 that is excluded from the signal path and black circles represent a Current Gain Stage 230 that is included in the signal path.

Figure 7:
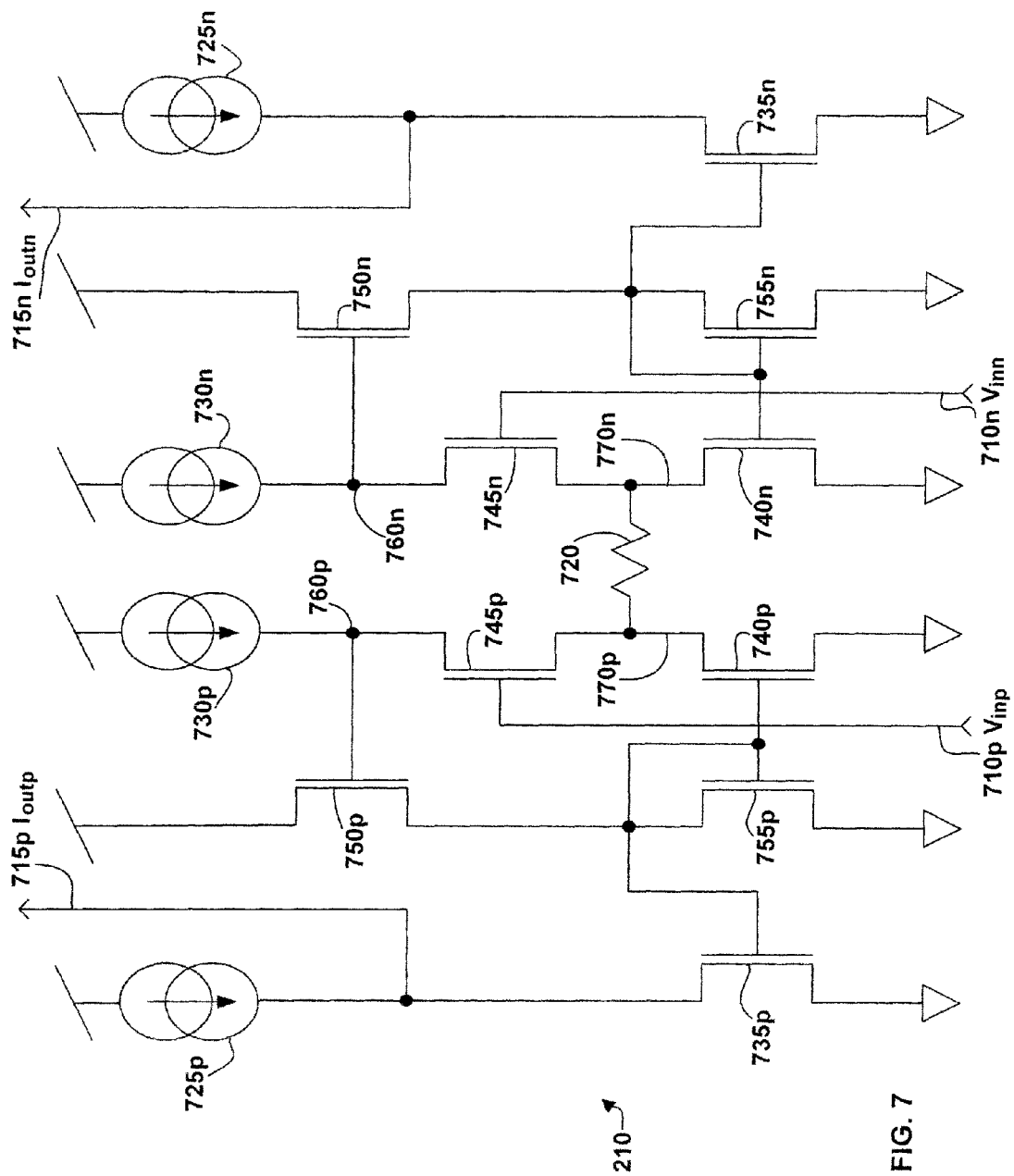
FIG. 7 illustrates a transconductor with resistor-dependent transconductance, according to various embodiments of the invention.

FIG. 7 illustrates an example of Transconductor 210, according to various embodiments of the invention. This example includes a differential transconductor comprising two Voltage Inputs 710p and 710n configured to receive voltages $V_{inp}$ and $V_{inn}$, respectively, and two Current Outputs 715p and 715n through which currents $I_{outn}$ and $I_{outp}$ are provided, respectively. The difference between the Current Outputs 715p and 715n is proportional to the difference between the Voltage Inputs 710p and 710n. Briefly, this embodiment of Transconductor 210 operates by copying the voltage difference between $V_{inp}$ and $V_{inn}$ across a Resistor 720 having resistance $R_{720}$. As a result of this voltage difference, a current $I_{R720}=(V_{inp}-V_{inn})/R_{720}$ flows across Resistor 720. This current results in a difference between the output currents $I_{outn}$ and $I_{outp}$. The transconductance of Transconductor 210 is determined by, for example, a value of the resistance $R_{720}$ and the ratio of current sources discussed elsewhere herein. Transconductors 210 of the type illustrated by FIG. 7 characterized by a transconductance that is inversely proportional to the resistance of a Resistor 720 are also referred to herein as Type-1 Transconductors 210.

More specifically, the embodiments of Transconductor 210 illustrated in FIG. 7 are optionally operated as follows. Transconductor 210 is biased by setting Current Sources 725p, 725n, 730p and 730n such that the currents provided by 725p and 725n are equal, and the currents provided by 730p and 730n are equal. In addition the following relation is held $I_{725p}/I_{730p}=(W_{735p}/L_{735p})/(W_{740p}/L_{740p})=M$, where $I_{725p}$ is the current provided by Current Source 725p, $I_{730p}$ is the current provided by Current Source 725p, $W_{735p}$ and $L_{735p}$ are the width and length of a Transistor 735p, $W_{740p}$ and $L_{740p}$ are the width and length of a Transistor 740p and M is a positive fractional number. The Transconductor 210 is symmetric in the sizes of transistors on either side of Resistor 720. As such. Transistors 735n and 740n are governed by the same relationship.

Transistors 745p and 745n are configured to operate as source followers and as such copy the voltages $V_{inp}$ and $V_{inn}$ minus a constant voltage to their sources, which are disposed on either side of Resistor 720. Because the gate-source voltage is the same for Transistors 745p and 745n, the difference in voltages at the sources of these transistors is the same as the difference in voltages at their gates. As a result, an excess current $(V_{inp}-V_{inn})/R_{720}$ flows across Resistor 720. This excess current must flow through Transistor 740p, and a current of the same magnitude but opposite sign (polarity) flows through Transistor 740n. These currents are generated by two local gain loops. The first of these loops comprises a Transistor 750p, a Transistor 755p, Transistor 740p and Transistor 745p. The second of these loops comprises a Transistor 750n, a Transistor 755n, Transistor 740n and Transistor 745n. Nodes 760p and 760n are high-impedance nodes which amplify any variation of voltage on the sources of Transistors 745p and 745n, respectively. The voltages at Nodes 760p and $760n$ are converted to currents by Transistors $750p$ and $750n$. These currents are fed back by a current mirror comprising Transistors $755p$ and $740p$, and a current mirror comprising Transistors $755n$ and $740n$. As a result of this negative feedback the input voltage difference $V_{inp}-V_{inn}$ is copied across Resistor $720$.

Because Transistors $735p$ and $740p$ have the same gate-source voltage, and because as is described elsewhere herein $I_{725p}/I_{730p}=(W_{735p}/L_{735p})/(W_{740p}/L_{740p})$, the ratio of their drain currents is $I_{drain735p}/I_{drain740p}=I_{725p}/I_{730p}$. Using Kirchhoff's Current Law the current $I_{725p}=I_{outp}+I_{drain735p}$ and the current $I_{730p}=I_R+I_{drain740p}$. Solving these equations yields that the current $|I_{outn}|$ must equal the current $I_{R720}$ through Resistor $720$. A similar set of relations hold for the other side of Transconductor $210$. Note, however, that $I_{outp}=-I_{outn}$. The transfer function of Transconductor $210$ illustrated in FIG. 7 is $I_{outp}=I_{outn}=2\,M(V_{inn}-V_{inp})/R_{720}$. Thus, its differential transconductance is defined as $g_{m1}=2M/R_{720}$.

In most IC fabrication processes, the resistance of resistors is not well controlled and can vary by as much as 45% or more between different fabrication lots. Thus, the transconductance of a Type-1 Transconductor $210$ may also vary. However, the total gain of the Programmable Gain Amplifier $120$ may be well controlled if the Back End $160$ has a voltage-to-current Conversion Circuit $250$ at the output, as illustrated in FIGS. 2, 3, 4A, and 4B, based on a resistor which is built using one or more copies of the same unit resistors which make up Resistor $720$, or is fabricated of the same material as Resistor $720$. In that case, the total gain of the Programmable Gain Amplifier $120$ is proportional to $g_{m1}R_{out}$, or equivalently, proportional to $R_{out}/R_{720}$. Since Conversion Circuit $250$ and Resistor $720$ are built with copies of the same unit resistor, or with resistors of the same material, the resistance change due to a variation of the fabrication process does not alter the ratio of their resistance. In other words, a total gain of the Programmable Gain Amplifier is independent of fabrication process variations which may affect the resistance of Resistor $720$.

Figure 8:
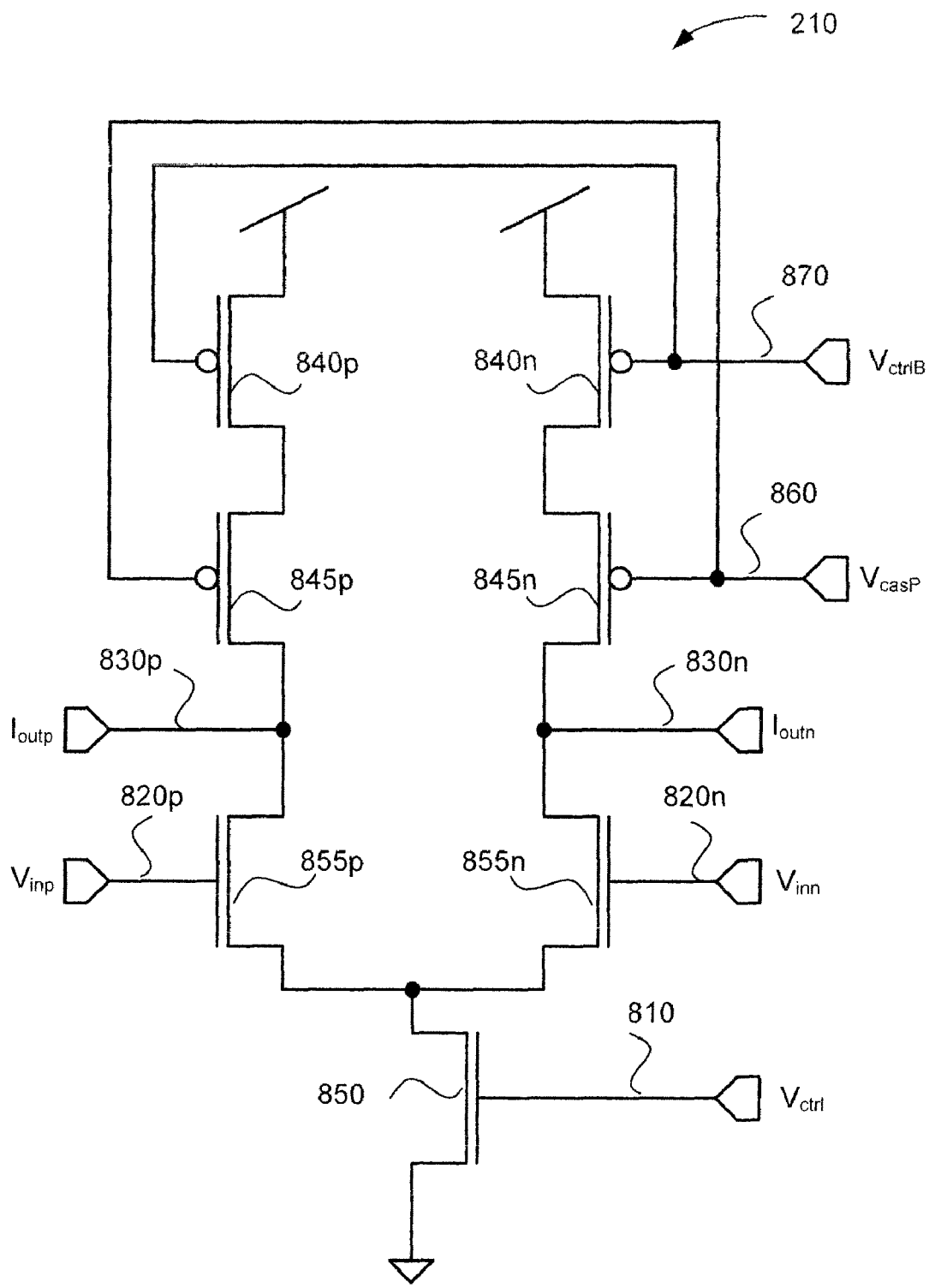
FIG. 8 illustrates a transconductor based on the transconductance of a transistor, according to various embodiments of the invention.

FIG. 8 illustrates another possible embodiment of a Transconductor $210$. In this case, the transconductance of Transconductor $210$ is proportional to the transconductance $(g_m)$ of Input Transistor $855n$ or Input Transistor $855p$, which are commonly sized equal. Transistors $840p$, $840n$, $845p$, $845n$ and $850$ are used to bias input Transistors $855p$ and $855n$. Transconductors $210$ of the type illustrated by FIG. 8 characterized by a transconductance that is proportional to the transconductance of a transistor are also referred to herein as Type-2 Transconductors $210$.

More specifically, a voltage input difference $(V_{inp}-V_{inn})$ creates a current difference $I_{outp}-I_{outn}=g_{m2}(V_{inp}-V_{inn})$, with $g_{m2}$ equal to the transconductance $g_m$ of Input Transistors $855n$ and $855p$. By definition, $g_{m2}$ is the transconductance of this embodiment of Transconductor $210$. The transconductance of Input Transistors $855n$ and $855p$ depends on the current flowing through them. The total current flowing through the Input Transistors $855n$ and $855p$ is generated by Transistor $850$ in response to a voltage $V_{ctrl}$ at its gate. The higher the current through Transistor $850$, the higher the transconductance $g_m$ of Input Transistors $855p$ and $855n$, and thus the higher the transconductance $g_{m2}$ of the Transconductor of FIG. 8.

Transistors $840p$ and $845p$ form a Current Source which supplies a current approximately equal to half the current flowing through Transistor $850$. Transistors $840n$ and $845n$ are commonly sized equal to $840p$ and $845p$, respectively. The input-dependent current from Transistor $855p$ and Transistor $855n$ are subtracted from the bias currents from $845p$ and $845n$, respectively, at nodes $830p$ and $830n$. When a low input-impedance circuit such as Current Gain Stages $230$ follows the circuit of FIG. 8, the excess differential current on nodes $830p$ and $830n$ will flow into Current Gain Stage $230$.

A Transconductor $210$ such as that of FIG. 8, or other possible embodiments of Transconductor $210$ having a transconductance that is directly based on the transconductance of one or more transistors, is typically better suited to high-gain and low-noise gain configuration, whereas resistor-based Transconductors $210$, such as that of FIG. 7, may be better suited to low-gain and high-linearity configurations.

Figure 9:
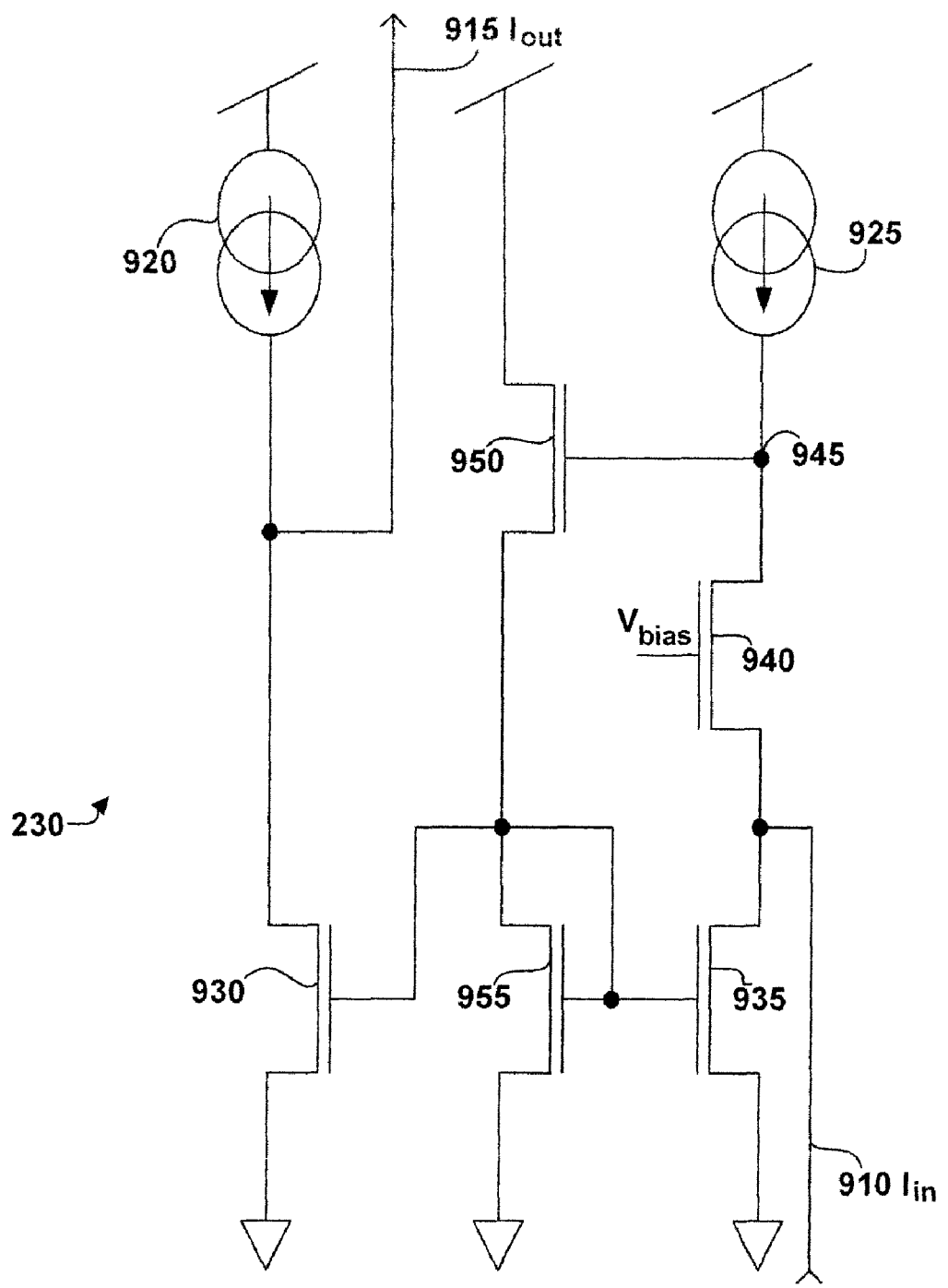
FIG. 9 illustrates a current-mode gain stage, according to various embodiments of the invention.

FIG. 9 illustrates an example of a Current Gain Stage $230$, according to various embodiments of the invention. This example is single sided and comprises one Current Input $910$ and one Current Output $915$. This circuit operates on the same local gain loop principle as the circuit illustrated in FIG. 7.

More specifically, a Current Source $920$ and a Current Source $925$ are biased such that their respective currents $I_{920}$ and $I_{925}$ are related by $I_{920}/I_{925}=(W_{930}/L_{935})/(W_{935}/L_{935})=N$, where $W_{930}$ and $L_{930}$ are the width and length of a Transistor $930$, $W_{935}$ and $L_{935}$ are the width and length of a Transistor $935$ and N a positive fractional number. A Transistor $940$ is a common-gate input with a fixed gate bias $V_{bias}$. A Node $945$ is a high-impedance node configured to amplify any variation of voltage on the source of Transistor $940$. The voltage at Node $945$ is converted into a current by a Transistor $950$ and fed back to the Current Input $910$ using a current mirror comprising a Transistor $955$ and a Transistor $935$. As a result of this negative feedback loop, the voltage on the source of Transistor $940$ is kept essentially constant for the range of possible currents provided through Current Input $910$. A fixed bias current $I_{925}$ therefore flows through Transistor $940$. The drain current through Transistor $935$ is therefore the sum of the current $I_{925}$ and the input current provided through Current Input $910$. As Transistors $935$ and $930$ have the same gate-source voltage, their drain currents ($I_{935}$ and $I_{930}$ respectively) have the relationship $I_{930}=|(W_{930}/L_{930})/(W_{935}/L_{935})$ $|I_{935}$, or equivalently $I_{drain930}=NI_{drain935}$. Again, applying Kirchhoff's Current Law one derives that $I_{915}=NI_{910}$, which is the transfer function for the illustrated circuit. Thus. N is also equal to the current gain of the circuit.

By selectively changing the fractional number N it is possible to change the current gain of Current Gain Stages $230$. Commonly, Transistor $935$ and Transistor $930$ are made up of multiple parallel copies of a smaller unit transistor. Accordingly. Transistor $935$ can consist of K parallel copies of the unit transistor and Transistor $930$ of J parallel copies of the unit transistor, where J and K are integer numbers. Thus, Transistors $930$ and $935$ have the same length but the ratio of their widths is J/K. The drain current ratio of two transistors of the same length but different widths driven by the same gate-to-source voltage equals the ratio of their widths. Thus, $I_{drain930}/I_{drain935}=J/K$. Therefore, as explained elsewhere herein $J/K=N=I_{915}/I_{910}$. The value of J and K can be varied by switching in and out of the signal path copies of the unit transistor. Thus, the gain of a Current Gain Stage $230$ can be varied by selectively switching in and out some unit transistors from the plurality of unit transistors of compound Transistors $930$ and $935$. If the widths of Transistor $930$ and $935$ are changed currents $I_{915}$ and $I_{910}$ should be changed accordingly so that the equality $N=I_{915}/I_{910}$ is maintained.

The transconductance of a Transconductor $210$ may depend on a physical variable which is different than the physical variable which controls the transconductance of another Transconductor of the plurality of Transconductors $210$. For instance, Transconductors $210A$ and $210E$ may be implemented with the circuit of FIG. 7, whose transconductance depends on the resistance of Resistor $720$, while Transconductor 210N may be implemented with the circuit of FIG. 8, whose transconductance depends on the transconductance of transistors. In those instances where the Front End 150 is implemented as an integrated circuit (IC), the two different physical variables may be affected differently by variabilities in the fabrication process of the integrated circuit. Differences of up to 45% or more between the transconductance of resistor-based and transistor-gm-based Transconductors 210 are possible. In addition, temperature changes will affect the transconductances of resistor-based and transistor-gm-based Transconductors differently. Transconductances dependent on the transconductance of a transistor are highly dependent on temperature. Temperature changes are common in integrated circuits used in consumer electronics, communication circuits, and other applications.

Uncontrolled transconductance values may cause, in some embodiments, that the effective total gain of Programmable Gain Amplifier 120 becomes unknown. Even more harmful to the performance of the communication system is that the differences in transconductance between different Transconductors 210 based on different types of transconductances will cause some gain steps to be unknown. For instance in FIG. 5B the gain difference between 510C and 510D may be the desired 0 dB, or −3 dB or +3 dB or some other value due to temperature and fabrication process variations. In addition, temperature changes may create gain instability (i.e., gain changes for a given configuration of switches 225 and 235) which may degrade further the performance of a receptor.

Figure 10:
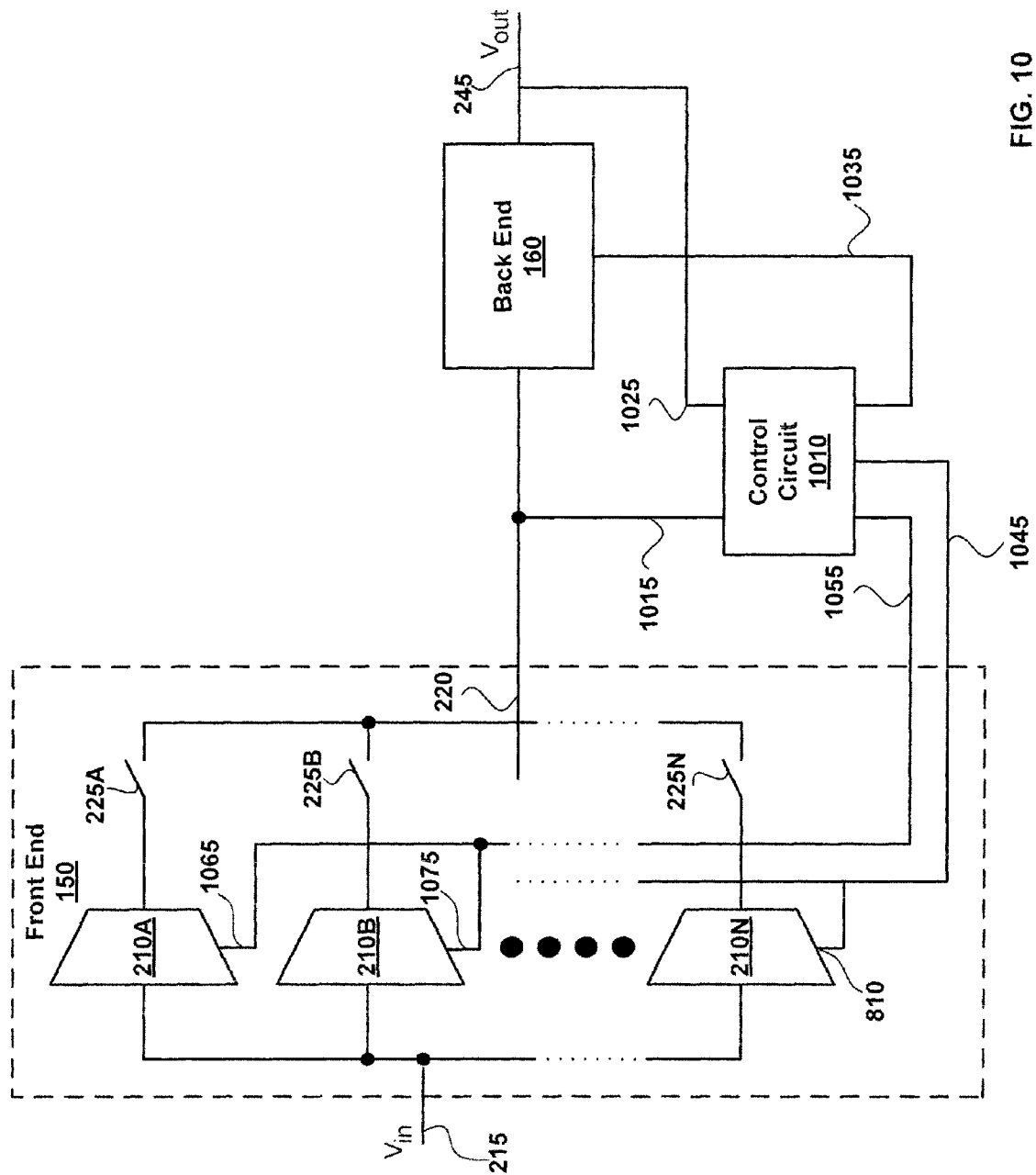
FIG. 10 illustrates a transconductance-adjustment system, according to various embodiments of the invention.

The uncontrolled gain steps described herein will be avoided if the Programmable Gain Amplifier 160 is modified as illustrated in FIG. 10. A Control Circuit 1010 may be configured to change the transconductance of one or more of the Transconductors 210 such that the gain of each configuration of switches 225 and 235 (gain configuration) is not dependent on either fabrication process or temperature variations. Optionally. Control Circuit 1010 may be configured so that the gain steps between gain configurations are controlled and do not vary with process and temperature.

Control Circuit 1010 modifies the transconductance of one or more Transconductors 210 (through connections 1055 and/or 1045), and/or the total gain current of the Back End 160 (through connection 1035), in response to the transconductance difference measured or estimated for the same or other Transconductors 210. Connection 1055 may be used to control the transconductance of Transconductors 210 of Type-1 and connection 1045 to control the transconductance of Transconductors 210 of Type-2.

In order to measure or estimate the transconductance of a Transconductor 210, Control Circuit 1010 may sense a signal (current or voltage) at the interface node 1015 between Front End 150 and Back End 160. Optionally, Control Circuit 1010 may sense, a signal at any point inside Back End 160 or at an output $V_{out}$ of Programmable Gain Amplifier 120. Alternatively, Control Circuit 1010 may contain replicas of one or more Transconductors 210. The replicas are used to estimate the temperature and process variation of the transconductance of a Transconductor 210 in the signal path.

Measurement and adjustment of transconductance difference can be made either: (a) while Transconductors 210 are being used by the communications system to receive information using signals from replica copies of one or more Transconductors 210 located inside Control Circuit 1010, (b) during periods when the communications system is not receiving information using a signal from a Transconductor 210 located in Front End 150, and/or (c) while Programmable Gain Amplifier is being used to receive information using known statistical characteristics of the signal at nodes 1015 or 245 or, alternatively of signals inside Front End 150 or Back End 160.

Figure 11:
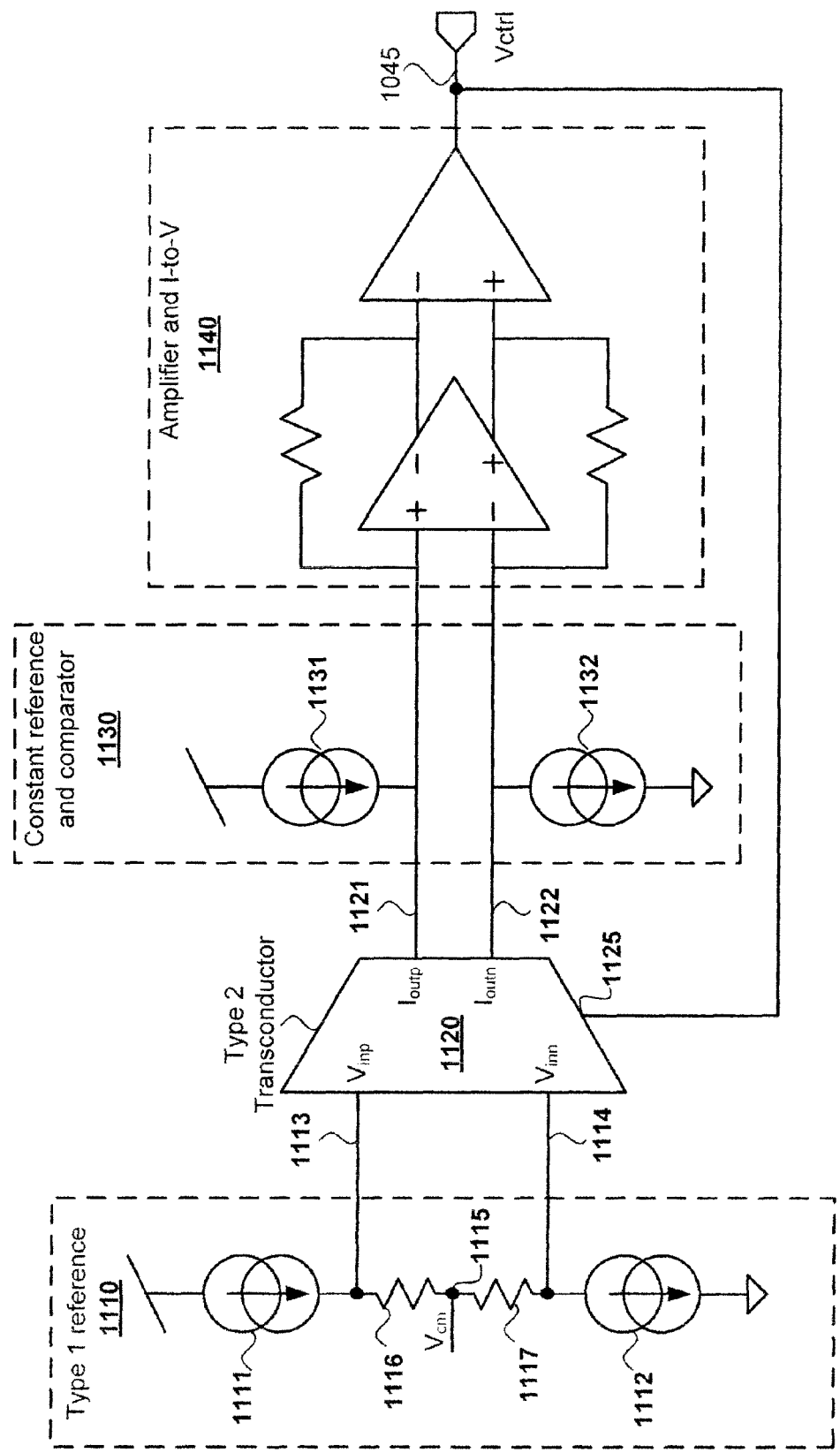
FIG. 11 illustrates a control circuit, according to various embodiments of the invention.

FIG. 11 illustrates an exemplary embodiment of Control Circuit 1010. In this embodiment, Control Circuit 1010 is used to change a transconductance of a Transconductor 210 in the Front End 150. The Control Circuit 1010 includes a Type-1 Reference Circuit 1110, a Replica Type-2 Transconductor 1120 that receives the output of the Type-1 Reference Circuit 1110, a Comparator 1130 that receives the output of the Replica Transconductor 1120, and an I-V Amplifier 1140 that receives the output of the Comparator 1130 and produces a control voltage that is fed back into the Replica Transconductor 1120 to create a negative feedback loop. More specifically, the Type-1 Reference Circuit 1110 is designed such that its voltage output will vary inversely proportionally to the transconductance $g_{m1}$ of a Type-1 Transconductor 210. The Replica Transconductor 1120 receives the voltage output and produces a current output that also varies inversely proportionally to the transconductance $g_{m1}$ of the Type-1 Transconductor 210, but varies in proportion to the transconductance $g_{m2}$ of the Type-2 Transconductor. The current output of the Replica Transconductor 1120 is compared against a threshold by the Comparator 1130 and the difference is converted by the I-V Amplifier 1140 into the control voltage. The control voltage is fed back to the Replica Transconductor 1120 and also sent through connection 1045 to a Type-2 Transconductor 210 in a Front End 150.

Accordingly, in the embodiment of Control Circuit 1010 shown in FIG. 11, the Resistors 1116 and 1117 have the same resistance. A node 1115 disposed between Resistors 1116 and 1117 is configured to receive the common-mode voltage $V_{cm}$ which is the average of the two input voltages $V_{inp}$ and $V_{inn}$. Both Resistors 1116 and 1117 are replicas of Resistor 720 (i.e., similar layout and material) of a Type-1 Transconductor 210. The resistance of Resistors 1116 and 1117 can be expressed as $R_{1116}=1/(\alpha\ g_{m1})$, where $g_{m1}=1/R_{720}$ and $\alpha=R_{720}/R_{1116}$ (the replica ratio) with $R_{720}$ and $R_{1116}$ the resistances of Resistors 720 and 1116, respectively. Here, a similar layout means that the replica is characterized by approximately the same geometric design and the same geometrical distances to other surrounding elements in the IC.

In operation. Current Sources 1111 and 1112 provide the same current $I_{1111}$ flowing through them. This current is approximately temperature and process independent. Such currents are typically generated in integrated circuits from a band-gap voltage and either trimmed resistors or an external off-chip high-precision resistor. Current $I_{1111}$ flows through resistors 1116 and 1117 and generates a voltage difference between nodes 1113 and 1114 which is proportional to the value of Resistors 1116 and 1117. That is, $V_{inp}-V_{inn}=2\ I_{1111}\ R_{1116}$, which can also be expressed as $V_{inp}-V_{inn}=2\ I_{1111}/(\alpha\ g_{m1})$. It should be noted that although the Type-1 Reference Circuit 1110 is implemented with two equal Resistors 1116 and 1117, this is not a requirement. In other embodiments three or more resistors are used in place of the two Resistors 1116 and 1117 such that the sum of the resistances of the resistors between Nodes 1115 and 1116 is equal to the sum of the resistances of the resistors between Nodes 1115 and 1117.

Replica Transconductor 1120 is a replica of a Type-2 Transconductor 210. Thus, the transconductance of Replica Transconductor 1120 is proportional to the transconductance $g_{m2}$ of a Type-2 Transconductor 210 of which it is a replica. In some embodiments, Replica Transconductor 1120 is a scaled replica, characterized by the same ratio of component values and layout dimensions between the Type-2 Transconductor 210 and Replica Transconductor 1120. A scaling ratio that represents the scale of the Replica Transconductor 1120 relative to the dimensions of the Type-2 Transconductor 210 can be less than one, one, or greater than one, in various embodiments. In operation, the ratio of the currents applied by the current sources within Replica Transconductor 1120 (corresponding to the Current Sources 920 and 925 in a Type-2 Transconductor 210) is the same ratio as the ratio, N, of the currents $I_{920}$ and $I_{925}$. The voltage difference at inputs $V_{inp}$ and $V_{inm}$ of Replica Transconductor 1120 will create a current output difference proportional to Resistor 720 (since 1116 and 1117 are replicas of Resistor 720). This current output difference can be expressed as $I_{outp} - I_{outm} = \beta\, g_{m2}\, (V_{inp} - V_{inm})$ where $g_{m2}$ is the transconductance of a Type-2 Transconductor 210 and $\beta$ is the ratio of transconductance between the same Type-2 Transconductor 210 and Replica Transconductor 1120.

By Kirchhoff's Current Law, the current output of Replica Transconductor 1120 is subtracted at nodes 1121 and 1122 from the current of two equally sized Current Sources 1131 and 1132 of the Comparator 1130. These currents are also independent of the fabrication process and temperature. The currents supplied by Current Sources 1131 and 1132 are optionally venerated in a similar manner to the currents of Current Sources 1111 and 1112. The excess current is injected into the I-V Amplifier 1140. The resulting voltage at node 1045 is fed-back to Replica Transconductor 1120 through input 1125. The transconductance of Replica Transconductor 1120 is positively proportional to the voltage at node 1045. In some embodiments, the feed-back voltage on input 1125 is directly applied to terminal $V_{ctrl}$ (node 810) of Replica Transconductor 1120, a replica of the embodiment of a Transconductor 210 illustrated in FIG. 8.

This negative feedback loop in Control Circuit 1010 tends to minimize the excess current injected to I-V Amplifier 1140. Thus, $(2\,\beta\, g_{m2}\, I_{1111}/\alpha\, g_{m1}) - 2\, I_{1131} = 0$, which can be expressed as $g_{m2}/g_{m1} = (\alpha/\beta)(I_{1131}/I_{1111})$. Currents $I_{1131}$ and $I_{1111}$ and replica ratios $\alpha$ and $\beta$ are approximately independent of fabrication process and temperature. Thus, the ratio of transconductances of the Type-2 and Type-1 Transconductors is made essentially independent of temperature and process variations. In addition to temperature and fabrication process independence, the transconductance ratio between Type-1 and Type-2 Transconductors can be controlled by controlling the Current Sources 1111 and 1131.

The embodiment of Control Circuit 1010 illustrated in FIG. 11 uses exclusively analog circuits. Other embodiments can include simple or complex digital circuits to measure and/or estimate a transconductance of a Transconductor 210 and to compensate a transconductance of a Transconductor 210. It will also be appreciated that the order of the Type-1 Reference Circuit 1110 and the Replica Transconductor 1120 in FIG. 11 can be reversed, in some embodiments. In these embodiments a constant voltage is applied to the Replica Transconductor 1120 and the current output is received by a reference circuit analogous to the Type-1 Reference Circuit 1110 which does not include Current Sources 1111 and 1112. A comparator would determine a difference between the voltage output of the reference circuit and the first constant voltage. A negative feedback loop based on the output of the comparator would be applied to the Replica Transconductor 1120. Still other variations are possible, for example, based on control signals used to change the switches of the circuits discussed below with reference to FIGS. 13A and 13B.

As was described elsewhere herein, when a resistor in a Conversion Circuit 250 of Back End 160 is based on copies of the same unit resistors used to build a Resistor 720 of a Type-1 Transconductor 210 in a Front End 150, or is fabricated from the same material as Resistor 720, a total gain of the Programmable Gain Amplifier 120 is independent of fabrication process variations and temperature changes for gain configurations with a Type-1 Transconductor 210 in the signal path. If, in addition, the ratio of transconductances of a Type-1 Transconductor and a Type-2 Transconductor is controlled to a known value with the embodiment of FIG. 11, or any other similar circuit, a total gain of Programmable Gain Amplifier 120 is made independent of process variabilities and temperature changes also for gain configuration with a Type-2 Transconductor in the signal path.

Figure 12:
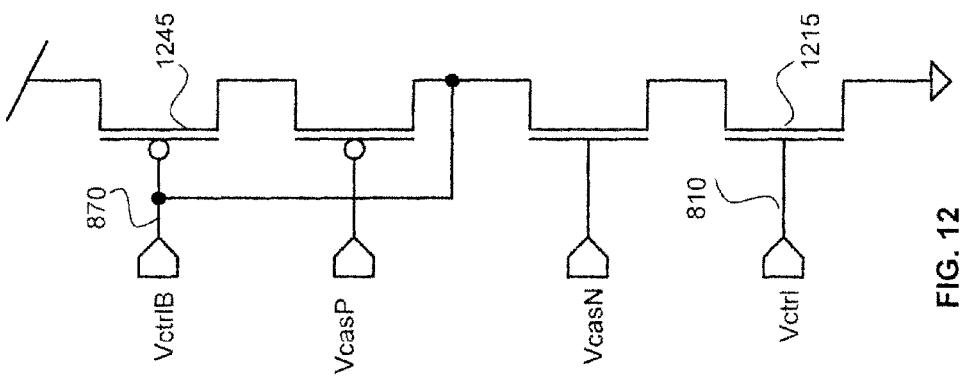
FIG. 12 illustrates a biasing circuit, according to various embodiments of the invention.

The exemplary embodiment of FIG. 11 controls the ratio of transconductances between a Type-1 Transconductor 210 and a Type-2 Transconductor 210. Optionally, the adjustment of transconductances can be achieved by controlling the transconductance of each of a Type-1 Transconductor and a Type-2 Transconductors. For instance, in the circuit of FIG. 11 if the input difference voltage of Replica Transconductor 1120 does not come from a Type-1 Reference Circuit 1110 but instead is a process independent known differential voltage, then the feed-back voltage applied to Node 1125 controls the value of the transconductance of the Type-2 Replica Transconducor 1120 and not a ratio of transconductances. Another similar circuit with feed-back can control the value of the transconductance of a Type-1 Transconductor 210, as is described below in relation to FIGS. 13A and 13B. FIG. 12 shows an exemplary circuit 1200 used to bias the circuit of FIG. 8 and illustrates how the output voltage $V_{ctrl}$ on node 1045 of I-V Amplifier 1140 can be used to modify the current flowing through transistors 855p and 855n. In operation, the output voltage on node 1045 (FIG. 11) is applied as Voltage at node 810 to a gate of a Transistor 1215 of the bias circuit 1200 of FIG. 12. The bias circuit 1200 generates the voltage $V_{ctrlB}$ which is applied to the gates of Transistors 840p and 840n in FIG. 8 in order to set the output bias voltage of nodes 830p and 830n which allows the Transconductor 210 of FIG. 8 to operate. In addition, $V_{ctrl}$ is applied to Transistor 850 of FIG. 8, which ultimately determines the transconductance of a Type-2 Transconductor 210.

Figure 13A:
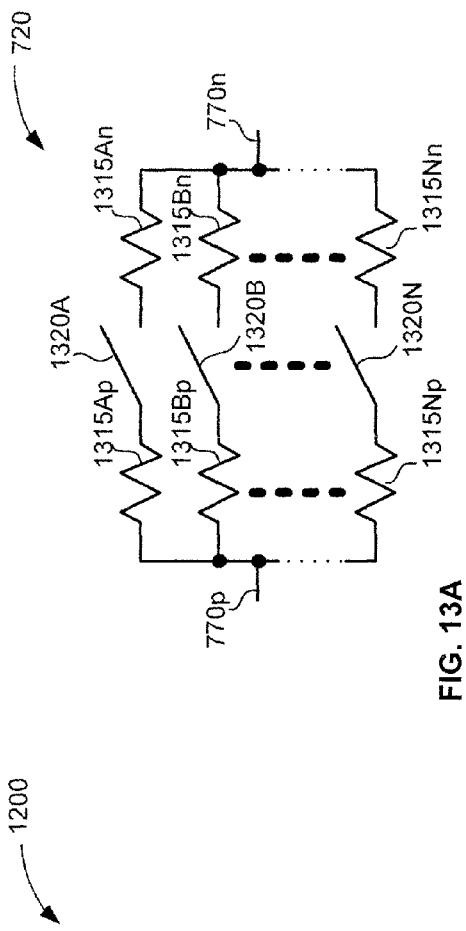
FIGS. 13A and 13B illustrate two exemplary variable resistance resistors, according to various embodiments of the invention.
Figure 13B:
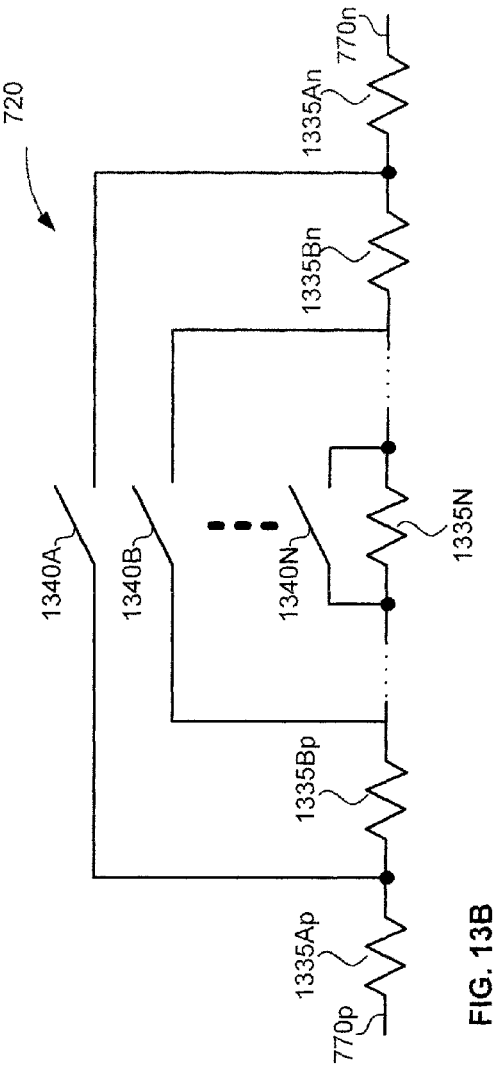

Transconductors 210 can also depend on other physical variables, allowing for other control schemes. In some embodiments the transconductances of Type-1 Transconductors 210 may be modified with the circuits of FIGS. 13A and 13B which illustrate different embodiments of variable resistance Resistors 720. Switches 1320 (FIG. 13A) and 1340 (FIG. 13B) are controlled by Control Circuit 1010 through output 1055 using additional digital circuitry (not shown). The effective resistance of either Resistor 720 is achieved by choosing to switch in or out of the signal path some Resistors 1335 in a series (FIG. 13B) or some Resistors 1315 in a parallel arrangement (FIG. 13A). FIGS. 13A and 13B illustrate just two of the possible ways to implement a variable Resistor 720. Optionally, a combination of series and parallel paths may be used, for example. Other possible embodiments of variable Resistor 720 that may be optionally controlled by Control Circuit 1010 include active resistances implemented with transistors biased in the ohmic region.

Figure 14:
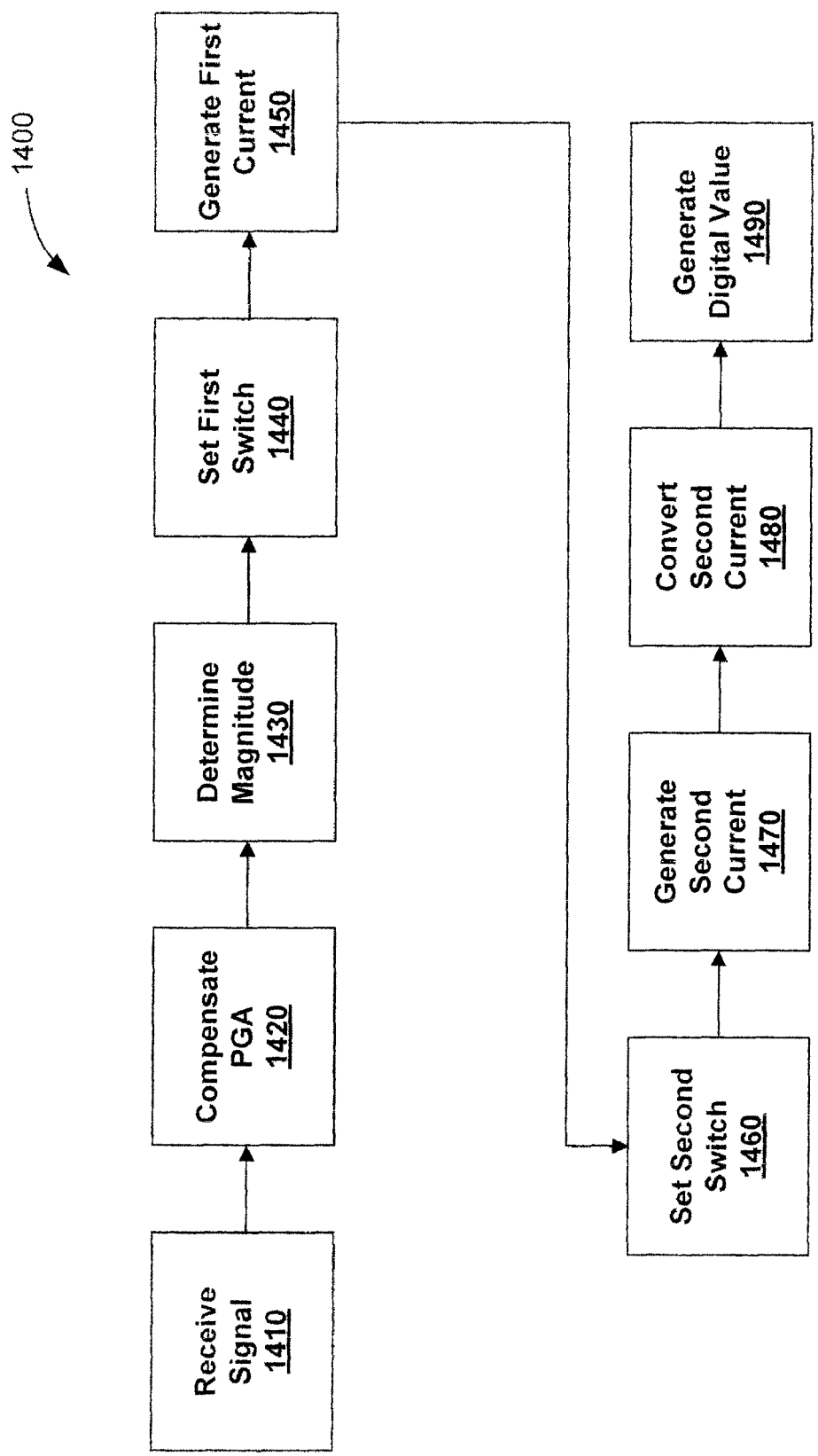
FIG. 14 illustrates a method of processing a signal, according to various embodiments of the invention.

FIG. 14 illustrates a method 1400 of processing a signal, according to various embodiments of the invention. In method 1400 a signal is received and measured, a Programmable Gain Amplifier 120 is configured based on the measurement, and then the signal is amplified by the Programmable Gain Amplifier 120. Configuring the Programmable Gain Amplifier 120 can include selecting a suitable gain to be applied to the received signal such that the amplified signal is matched to an input characteristic of a subsequent circuit, such as Analog to Digital Converter 130. The method 1400 can also include processing the signal with the subsequent circuit.

In a Receive Signal Step 1410, a signal is received, for example from a Signal Source 110. The received signal may comprise a magnitude in a known (predictable) or unknown (unpredictable) range. For example, if the signal is received via an antenna, variable length conductor, or the like, the magnitude of the signal may be attenuated by an unpredictable amount before it is received. The received signal optionally comprises digitally encoded data. The received signal optionally comprises a modulated voltage or current.

In an optional Compensate PGA Step 1420, the Programmable Gain Amplifier 120 is controlled to compensate for temperature variations, for example. Compensate PGA Step 1420 is described in greater detail with respect to a method 1500 illustrated by FIG. 15.

In an optional Determine Magnitude Step 1430, information about the magnitude of the received signal is determined. This information may comprise an absolute value of the magnitude of the signal, while in other embodiments the information comprises a comparative value such as that the magnitude of the signal is below, within, or above a set voltage or current magnitude range. Determine Magnitude Step 1430 may include applying the signal to a comparator, digitizing the signal, or making some other measurement of the signal. The voltage or current magnitude range against which the signal magnitude may be compared can be, in some embodiments, an input range for a subsequent circuit like Analog to Digital Converter 130.

In some embodiments Determine Magnitude Step 1430 is performed by Control Logic 140 (FIG. 1). Optionally, Control Logic 140 may contain an automatic gain control circuit that is configured to determine the magnitude of the signal, or a training signal, through the use of an algorithm that characterizes the signal according to a parameter such as peak, RMS, histogram, threshold, amount of clipping, frequency analysis, combinations thereof, etc. Control Logic 140 and the automatic gain control may be responsive to a signal at the input, the output or one or more points inside of PGA 120.

In a Set First Switch Step 1440, one or more Switches 225 within Front End 150 are set to select one or more of Transconductors 210 to be included in the signal path of Front End 150. The set Switches 225 may be set to a default setting or to a setting in response to the information determined in Determine Magnitude Step 1430. For example, if the information includes that the signal has a voltage magnitude greater than an optimal input voltage range of Transconductor 210A, then Switches 225 may be set for Transconductor 210B (or some other appropriate member or combination of Transconductors 210) to be included within the signal path of Front End 150. The setting of Switches 225 will result in a current path through Front End 150 that includes one or more Transconductors 210. Set First Switch Step 1440 is optionally performed using Control Logic 140.

In a Generate First Current Step 1450, a first current is generated using the Transconductors selected from the plurality of Transconductors 210 selected in Set First Switch Step 1440. This current is typically related to the magnitude of the received signal. For example, the generated current may vary proportionally with the received voltage, the proportionality constant being the sum of the one or more selected transconductances from the plurality of Transconductors 210. The magnitude of the generated current is dependent on which of the Transconductors 210 was selected using Switches 225. The generated current is provided to the Output 220 of Front End 150.

In a Set Second Switch Step 1460, one or more Switches 235 within Back End 160 are set to select which of Current Gain Stages 230 are included in the signal path within Back End 160 and, thus, select a gain of Back End 160. The set Switches 235 and set Switches 410 may be set to a default setting or a setting in response to the information determined in Determine Magnitude Step 1430. FIGS. 5A, 5B, and 6 illustrate some possible gain states of Front End 150 and Back End 160. Optionally, the gain of Back End 160 is selected to modify the output of Front End 150 to better match input characteristics of subsequent circuits. For example, the gain of Back End 160 may be selected to match an input range of Analog to Digital Converter 130. The setting of Switches 235 and Switches 410 may result in a signal path that includes all of the Current Gain Stages 230, in a signal path that includes one or more of Current Gain Stages 230 but not others of Current Gain Stages 230, or a current path that includes none of Current Gain Stages 230. Set Second Switch Step 1460 is optionally performed using Control Logic 140.

In a Generate Second Current Step 1470, Back End 160 is used to generate a second current proportional to the current generated using Front End 150 in Generate First Current Step 1450. This current may be generated by passing the output of Front End 150 through some but not others of Current Gain Stages 230.

In an optional Convert Second Current Step 1480, the current generated in Generate Second Current Step 1470 is converted to a voltage using Conversion Circuit 250. This optionally includes passing the current through a resistor.

In an optional Generate Digital Value Step 1490, the signal received via Front End 150 and Back End 160 is converted to a digital value, for example using Analog to Digital Converter 130. This digital value may be 8-bit, 16-bit, 24-bit, 32-bit or some other data size. The digital value is optionally provided to Control Logic 140. Control Logic 140 may use this value as feedback to set Switches 225 and/or Switches 235.

The order of steps illustrated in FIG. 14 may be different in other embodiments. For example, in some embodiments Set First Switch Step 1440 and Set Second Switch Step 1460 are performed in parallel or subsequent to each other. Likewise, if Switches 225, 235 and 410 are initially set to default values, then these steps may occur for the first time before a signal is received. The method illustrated in FIG. 14 may be repeated. For example, during reception of a signal, if the intensity range of the signal varies, then Programmable Gain Amplifier 120 may be reprogrammed dynamically. Further, the method may be performed repeatedly in an iterative process until switch settings appropriate to the received signal are found. Viewed as a dynamic process, method 1400 can alternatively be viewed as comprising at least a step of measuring a change in the magnitude of a signal, and a step of changing a configuration of a Programmable Gain Amplifier 120 in response to the change in the signal magnitude.

In some embodiments, by separately selecting those elements of Front End 150 and Back End 160 through which the signal passes, each total gain state of Programmable Gain Amplifier 120 can be set to an optimal point for the trade-off between linearity and signal-to-noise ratio. For example, for a large input signal linearity is typically more critical than low noise. For these signals a relatively low transconductance, e.g., Transconductor 210A, is selected in Front End 150. For smaller input signals, a larger input transconductance, e.g., Transconductor 210N, is used in Front End 150 and more of the total gain is applied in Front End 150. This tends to minimize noise.

Figure 15:
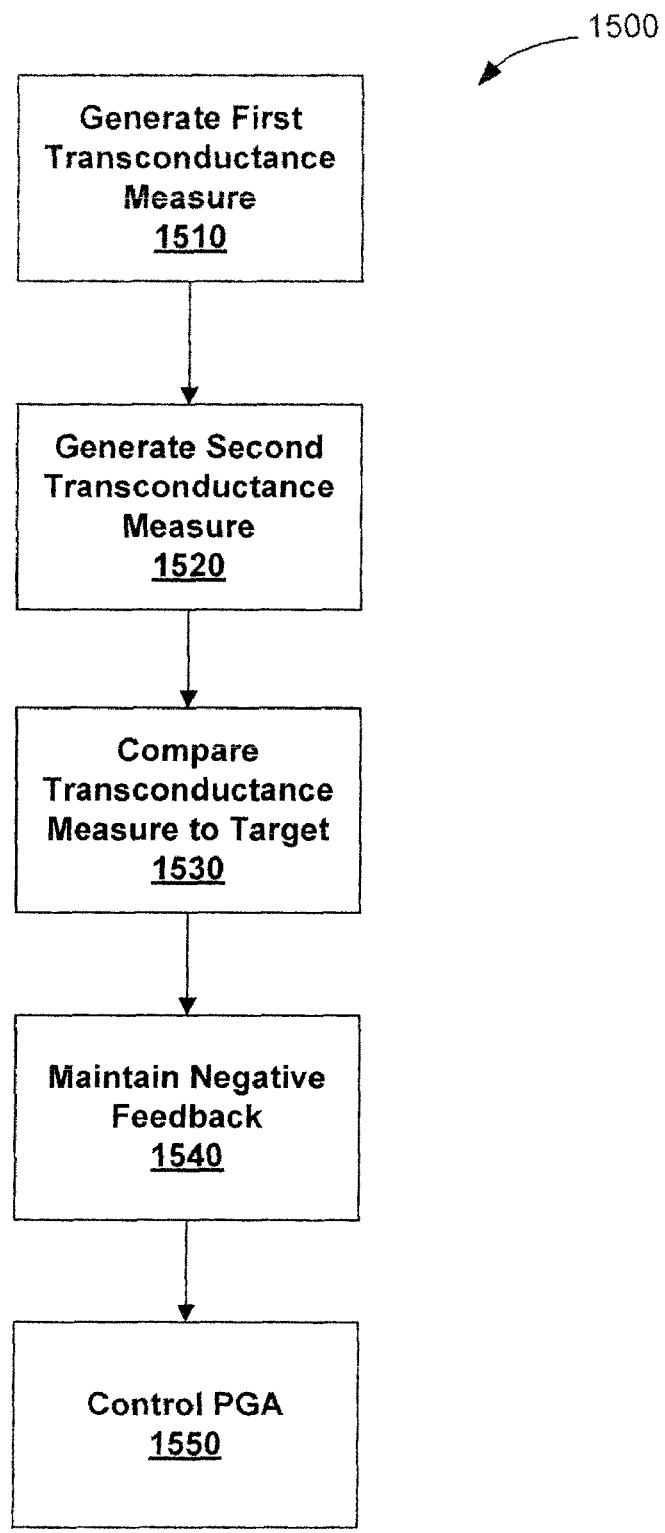
FIG. 15 illustrates a method of controlling a programmable gain amplifier to compensate for various variabilities, according to various embodiments of the invention.

FIG. 15 illustrates a method 1500 of controlling the Programmable Gain Amplifier 120 to compensate, for example, for temperature variations and fabrication process variability. Although FIG. 15 provides an order to the steps, it will be understood from the following that the order of certain steps can be reversed in some embodiments. The method 1500 comprises a Generate First Transconductance Measure Step 1510. Generate First Transconductance Measure Step 1510 can be performed, for example, using a resistor-based reference circuit such as Type-1 Reference Circuit 1110. Generating the first transconductance measure can be achieved, for example, by applying equal currents across each of two equal resistances in series as in the Type-1 Reference Circuit 1110 shown in FIG. 11 to generate a voltage output. The voltage output can be measured as a difference between the voltages on two Nodes 1113 and 1114, for example. In other instances, the transconductance measure of Step 1510 can be produced by an output current from a Replica Transconductor 1120 with a known (independent of process fabrication and temperature) voltage input difference. As used herein, voltage outputs and current outputs can be either in a single-ended or a differential mode.

A transconductance measure of a Transconductor 210 refers herein to a measure that is either proportional to the transconductance, proportional to the inverse of the transconductance, or proportional to any other mathematical function dependent on the transconductance of that Transconductor 210.

The method 1500 further comprises a Generate Second Transconductance Measure Step 1520. Generate Second Transconductance Measure Step 1520 can be performed using a Replica Transconductor 1120 characterized by a transconductance that is based on the transconductance $g_m$ of transistors therein. As described with respect to FIG. 11, Replica Transconductor 1120 can be a scaled replica of another Type-2 Transconductor 210 of a Programmable Gain Amplifier 120. The current output can be generated, for instance, by applying the voltages on Nodes 1113 and 1114 to the inputs of the Replica Transconductor 1120. Thus, the output current is proportional to a Resistor 720 of a Type-1 Transconductor 210, and thus inversely proportional to the transconductance of the Type-1 Transconductor 210. The output current can be a difference between the currents on two output nodes 1121 and 1122 of the Replica Transconductor 1120. With this arrangement, the output current is proportional to the ratio of the transconductance of a Type-2 Transconductor 210 and the transconductance of a Type-1 Transconductor 210.

In other instances, the transconductance measure is the voltage across a resistance of a Type-1 Reference circuit 1110 (without Current Sources 1111 and 1112) to which is applied the output current of a Type-2 Transconductor 210 driven by a known voltage independent of process fabrication variability and temperature. In either case, the transconductance measure is dependent on a negative feedback based on either a control voltage applied to the Replica Transconductor 1120 or based on a control signal which determines the resistance of the Type-1 Reference Circuit 1110.

In other embodiments, the result of a Generate Second Transconductance Measure Step 1520 is not a ratio between the transconductance of Type-1 and Type-2 Transconductors 210, but instead, a measure of the value of the transconductance of a Transconductor 210 of a different type than that whose transconductance was measured in the Generate First Transconductance Measure Step 1510. For instance, if the result of a Generate First Transconductance Measure Step 1510 is a measure of the transconductance of a Type-1 Transconductor 210, then a Generate Second Transconductance Measure Step 1520 give as a result a measure of the transconductance of a Type-2 Transconductor, and vice-versa. In embodiments of Method 1500 where the result of a Generate Second Transconductance Measure Step 1520 is a measure of the value of a transconductance, instead of a ratio of transconductances, then Step 1520 and Step 1510 may be performed in parallel or by reversing the order of these two Steps.

The method 1500 further comprises a Compare Transconductance Measure to Target Step 1530. The Compare Transconductance Measure to Target Step 1530 can be performed by a Comparator 1130, for example. When the result of a Generate Second Transconductance Measure Step 1520 is not a ratio of transconductances, Compare Transconductance Measure to Target Step 1530 may comprise comparing independently the measures resulting from the Generate First Transconductance Measure Step 1510 and the measure resulting from the Generate Second Transconductance Measure Step 1520 with separate transconductance targets for Type-1 and Type-2 Transconductors 210.

In some embodiments, Compare Transconductance Measure to Target Step 1530 comprises comparing the output current to a target current to generate an excess current as in FIG. 11. In other embodiments, the comparison to the target comprises comparing an output voltage to a target voltage to generate a difference voltage.

The method 1500 further comprises a Maintain Negative Feedback Step 1540. Maintain Negative Feedback Step 1540 can be performed, in some embodiments, by injecting the excess current into an I-V amplifier 1140, for instance, where the I-V amplifier 1140 produces a feedback voltage that is applied to a control terminal of the Replica Transconductor 1120. In other embodiments, a difference voltage from the comparison with a target voltage is amplified to produce the feedback voltage. Optionally, the feedback voltage may be further processed to control the resistance of a compound resistor 1116 and 1117 of a Type-1 Reference Circuit 1110, with or without Current Source 1111 and 1112.

When a Generate Second Transconductance Measure Step 1520 does not give a measure of transconductance ratios, a Maintain Negative Feedback Sep 1540 may consist in producing two independent feedback voltages which, after optional further processing, control independently the resistance of a Type-1 Reference Circuit 1110, or a Replica Type-1 Transconductor, and the transconductance of transistors in a Type-2 Transconductor Replica 1120.

The method 1500 further comprises a Control PGA Step 1550. Control PGA Step 1550 can be performed, for example, by also applying the feedback voltage to a Type-2 Transconductor 210 of the Programmable Gain Amplifier 120. More specifically the feedback voltage is applied to the gate of Transistor 850 and can be used to generate a voltage $V_{ctrlB}$ applied to gates of Transistors 840*p* and 840*n*.

Control PGA Step 1550 optionally also comprises varying the resistance of a variable resistance Resistor 720 of a Type-1 Transconductor 210 of the Programmable Gain Amplifier 120. Varying the resistance of the variable resistance Resistor 720 can be achieved, for example, by selecting Resistors 1315 and/or 1335 of the variable resistance Resistor 720.

Several embodiments are specifically illustrated and/or described herein. However, it will be appreciated that modifications and variations are covered by the above teachings and within the scope of the appended claims without departing from the spirit and intended scope thereof. For example, while the embodiments discussed herein comprise a back end in which amplification occurs in a current mode, in alternative embodiments the front end is configured to output a voltage and the back end is configured to amplify in a voltage mode.

While the Programmable Gain Amplifier 120 is described herein as being used to amplify a signal prior to being received by Analog to Digital Converter 130, the Programmable Gain Amplifier 120 may be used in other applications wherein programmable amplifiers are used. In some embodiments, a variable amplifier is included in the front end and/or back end. The terms first and second, etc. as used as adjectives in the claims are not meant to particular physical ordering, rather they are meant merely to distinguish elements. In embodiments wherein the signal received by Programmable Gain Amplifier 120 is in a current mode, the parallel Transconductors 210 of Front End 150 may be replaced by parallel current gain stages similar to Current Gain Stages 230.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. A system comprising:
   a programmable gain amplifier including
      a front end having a plurality of selectable transconductors arranged in parallel, and
      a back end configured to receive an output of the front end and having a plurality of selectable current gain stages arranged in series; and
   a control circuit configured to change the transconductance of one or more of the plurality of selectable transconductors such that the gain configurations of the programmable gain amplifier are independent of temperature variations.

2. The system of claim 1 wherein the plurality of selectable transconductors includes both Type-1 and Type-2 transconductors and the control circuit is configured to control the Type-1 and Type-2 transconductors independently.

3. The system of claim 1 wherein the control circuit is configured to change the transconductance of the one or more of the plurality of selectable transconductors responsive to a signal measured within the back end.

4. The system of claim 1 wherein the control circuit is configured to change the transconductance of the one or more of the plurality of selectable transconductors responsive to an output of the programmable gain amplifier.

5. The system of claim 1 wherein the control circuit comprises a replica of a transconductor of the plurality of selectable transconductors.

6. The system of claim 1 wherein the control circuit is further configured to bias the transconductors of the plurality of selectable transconductors with a first control voltage, the control circuit including
   a replica transconductor, being a replica of a transconductor of the plurality of selectable transconductors of the front end, the replica transconductor being biased by the first control voltage and configured to generate a current output, and
   circuitry configured to generate the first control voltage from a difference between a threshold and a signal based on the current output.

7. The system of claim 6 wherein the control circuit further comprises a reference circuit configured to generate a transconductance measure.

8. The system of claim 7 wherein the replica transconductor is configured to receive the transconductance measure.

9. The system of claim 7 wherein the replica transconductor is configured to receive a constant voltage, and wherein the reference circuit is configured to receive the current output and generate the signal.

10. The system of claim 7 wherein the reference circuit comprises two resistors in series between two current sources each configured to generate a same current, wherein
    a first node is disposed between a first end of the resistors in series and a first of the two current sources,
    a second node is disposed between a second end of the resistors in series and a second of the two current sources, and
    wherein the transconductance measure comprises a voltage difference between the first and second nodes.

11. The system of claim 10 wherein the reference circuit further comprises a third node disposed at an intermediate point between the resistors in series and configured to be biased with a common-mode voltage.

12. The system of claim 6 wherein the replica transconductor is a scaled replica of the transconductor of the plurality of transconductors.

13. The system of claim 6 further comprising a bias circuit configured to receive the first control voltage and generate a second control voltage, and
    apply the second control voltage to the gates of each of two transistors of a current source of the transconductor of the plurality of selectable transconductors.

14. The system of claim 1 wherein a transconductor of the plurality of selectable transconductors includes a variable resistance resistor.

15. The system of claim 14 wherein the variable resistance resistor includes a plurality of selectable resistors in parallel.

16. The system of claim 14 wherein the variable resistance resistor includes a plurality of selectable resistors in series.

17. A system comprising:
    a programmable gain amplifier including
       a front end having a plurality of selectable transconductors arranged in parallel, and
       a back end configured to receive an output of the front end and having a plurality of selectable current gain stages arranged in series, a current gain stage of the plurality of selectable current gain stages having a variable gain; and
    a control circuit configured to change a gain of the programmable gain amplifier by selecting a transconductor in the front end or by selecting a current gain stage in the back end, the current gain stage including a transistor comprising parallel selectable copies of a smaller unit transistor, wherein a gain of the current gain stage is a function of the number of selected unit transistors.

18. A method comprising:
    generating a first transconductance measure with a first circuit;
    comparing the first transconductance measure to a first target;
    maintaining a first negative feedback voltage to control the first circuit based on the comparison of the first transconductance measure to the first target; and
    controlling a programmable gain amplifier with the first negative feedback voltage.

19. The method of claim 18 wherein the first transconductance measure comprises a transconductance ratio.

20. The method of claim 18 wherein the first transconductance measure comprises a transconductance value.

21. The method of claim 18 wherein the first circuit comprises a replica of a transconductor of the programmable gain amplifier.

22. The method of claim 18 wherein the first circuit comprises a resistor-based reference circuit.

23. The method of claim 18 further comprising generating a second transconductance measure of a second circuit, and comparing the second transconductance measure to a second target.

24. The method of claim 23 further comprising maintaining a second negative feedback voltage to control the second circuit based on the comparison of the second transconductance measure to the second target.

* * * * *